United States Patent
Clausen et al.

(10) Patent No.: US 6,272,038 B1
(45) Date of Patent: Aug. 7, 2001

(54) HIGH-DENSITY NON-VOLATILE MEMORY DEVICES INCORPORATING THIOL-DERIVATIZED PORPHYRIN TRIMERS

(75) Inventors: Peter C. Clausen; Jonathan S. Lindsey, both of Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/483,109

(22) Filed: Jan. 14, 2000

(51) Int. Cl.[7] .................................................. G11C 11/00
(52) U.S. Cl. ............................................ 365/151; 365/152
(58) Field of Search .................................... 365/151, 152, 365/153; 536/23.1

(56) References Cited

U.S. PATENT DOCUMENTS

| | | |
|---|---|---|
| 4,670,860 | 6/1987 | Wilson ................................... 365/106 |
| 5,010,451 | 4/1991 | Ueyama et al. ....................... 361/504 |
| 5,016,063 | 5/1991 | Beratan et al. ........................... 357/8 |
| 5,035,835 | 7/1991 | Asakawa et al. ...................... 252/500 |
| 5,063,417 | 11/1991 | Hopfield .................................... 357/8 |
| 5,091,502 | 2/1992 | Narang et al. ........................ 528/229 |
| 5,135,637 | 8/1992 | Eida et al. ............................. 205/317 |
| 5,252,698 | 10/1993 | Bhardwaj et al. .................... 528/230 |
| 5,264,876 | 11/1993 | Kawade et al. ..................... 346/153.1 |
| 5,312,896 | 5/1994 | Bhardwaj et al. .................... 528/353 |
| 5,434,842 | 7/1995 | Weiss et al. .......................... 369/126 |
| 5,506,420 | 4/1996 | Kossovsky et al. ................... 257/40 |
| 5,539,100 | 7/1996 | Wasielewski et al. ................ 540/145 |
| 5,578,718 | * 11/1996 | Cook et al. .......................... 536/23.1 |
| 5,744,598 | 4/1998 | Skalkos et al. ....................... 540/472 |
| 5,858,666 | 1/1999 | Weiss ....................................... 435/6 |

FOREIGN PATENT DOCUMENTS

| | | | |
|---|---|---|---|
| 0 272 935 A2 | 6/1988 | (EP) | ................................ G11B/9/08 |
| 0 307 210 A2 | 3/1989 | (EP) | ................................ G11B/21/00 |
| 0 307 211 A2 | 3/1989 | (EP) | ................................ G11B/21/00 |
| 0 363 147 A2 | 4/1990 | (EP) | ................................ G11B/9/00 |

OTHER PUBLICATIONS

Gorman; Encapsulated Electroactive Molecules, *Adv. Mater.*, 9(14):1117–1119 (1997).
Gorman et al.; Molecular Structure–Property Relationships for Electron–Transfer Rate Attenuation in Redox–Active Core Dendrimers, *J. Am. Chem. Soc.*, 121(43):9958–9966 (1999).
Ferrocene–Molecule of the Month Jun. 1996, *University of Oxford Web Page*, http://www.ncl.ox.ac.uk/mom/ferrocene/ferrocene2.html.
Ferrocene—Synthesis, *University of Oxford Web Page*, htp://www.ncl.ox.ac.uk/mom/ferrocene/synthesis.html.
Collier et al.; Electrically Configurable Molecular–Based Logic Gates, *Science*, 285:391–394 (1999).
Bocian et al.; U.S. Pat. application entitled *High Density Non–Volatile Memory Device*, Ser. No. 09/346,228; Filed Jul. 1, 1999.
Gryko et al., U.S. Pat. application entitled *High Density Non–Volatile Memory Device Incorporating Thiol–Derivatized Porphyrins*, Ser. No. 09/346,221; Filed Jul. 1, 1999.

* cited by examiner

*Primary Examiner*—Son T. Dinh
(74) *Attorney, Agent, or Firm*—Myers Bigel Sibley & Sajovec

(57) ABSTRACT

The present invention provides high density, non-volatile memory devices incorporating winged trimers of porphyrinic macrocycles. In preferred embodiments, the two wing porphyrinic macrocycles are the same, and both are different from the center macrocycle. Such molecules are relatively easy to synthesize, have four different and distinguishable oxidation states, and thus provide molecules, information storage media and apparatus that store two bits of information.

84 Claims, 13 Drawing Sheets

HIGH-DENSITY NON-VOLATILE MEMORY DEVICES INCORPORATING THIOL-DERIVATIZED PORPHYRIN TRIMERS

This invention was made with Government support under Grant No. N00014-99-1-0357 from the Office of Naval Research. The Government has certain rights to this invention.

FIELD OF THE INVENTION

This invention relates to memory devices. In particular, this invention provides an electronic memory device capable of storing information in extremely high density.

BACKGROUND OF THE INVENTION

Basic functions of a computer include information processing and storage. In typical computer systems, these arithmetic, logic, and memory operations are performed by devices that are capable of reversibly switching between two states often referred to as "0" and "1". In most cases, such switching devices are fabricated from semiconducting devices that perform these various functions and are capable of switching between two states at a very high speed using minimum amounts of electrical energy. Thus, for example, transistors and transistor variants perform the basic switching and storage functions in computers.

Because of the huge data storage requirements of modern computers, a new, compact, low-cost, very high capacity, high speed memory configuration is needed. To reach this objective, molecular electronic switches, wires, microsensors for chemical analysis, and opto-electronic components for use in optical computing have been pursued. The principal advantages of using molecules in these applications are high component density (upwards of $10^{18}$ bits per square centimeter), increased response speeds, and high energy efficiency.

A variety of approaches have been proposed for molecular-based memory devices. While these approaches generally employ molecular architectures that can be switched between two different states, all of the approaches described to date have intrinsic limitations making their uses in computational devices difficult or impractical.

For example, such approaches to the production of molecular memories have involved photochromic dyes, electrochromic dyes, redox dyes, and molecular machines all have fundamental limitations that have precluded their application as viable memory elements. However, these molecular architectures are typically limited by reading/writing constraints. Furthermore, even in cases where the effective molecular bistability is obtained, the requirement for photochemical reading restricts the device architecture to a 2-dimensional thin film. The achievable memory density of such a film is unlikely to exceed $10^{10}$ bits/cm². Such limitations greatly diminish the appeal of these devices as viable molecular memory elements.

SUMMARY OF THE INVENTION

This invention provides novel high density memory devices that are electrically addressable, permitting effective reading and writing, that provide a high memory density (e.g., $10^{15}$ bits/cm³), that provide a high degree of fault tolerance, and that are amenable to efficient chemical synthesis and chip fabrication. The devices are useful in a variety of personal and industrial applications, and support destructive or non-destructive read cycles.

In a preferred embodiment, this invention provides an apparatus for storing data (e.g., a "storage cell"). The storage cell includes a fixed electrode electrically coupled to a "storage medium" having a multiplicity of different and distinguishable oxidation states where data is stored in the (preferably non-neutral) oxidation states by the addition or withdrawal of one or more electrons from said storage medium via the electrically coupled electrode. In preferred storage cells, the storage medium stores data at a density of at least one bit, and preferably at a density of 2 bits. Thus, preferred storage media have at least 2, and preferably 4, different and distinguishable oxidation states. In particularly preferred embodiments, the bits are all stored in non-neutral oxidation states. In a most preferred embodiment, the different and distinguishable oxidation states of the storage medium can be set by a voltage difference no greater than about 5 volts, more preferably no greater than about 2 volts, and most preferably no greater than about 1 volt.

Storage media used to carry out the invention preferably comprise a winged trimer or "winged spider" molecule according to Formula I:

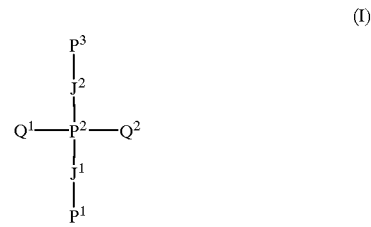

wherein:
$P^1$ and $P^3$ are porphyrinic macrocycles (and are preferably selected to have the same oxidation state);
$P^2$ is a porphyrinic macrocycle selected to have an oxidation state different from $P^1$ and $P^3$;
$J^1$ and $J^2$ are independently selected linkers that permit electron transfer between the porphyrinic macrocycles; and
$Q^1$ and $Q^2$ are each independently selected linkers (e.g., protected or unprotected thiol linkers).

In preferred embodiments of the invention which are relatively simple to synthesize, the molecule of Formula I has four different and distinguishable oxidation states and thus provides a molecule and storage medium that is capable of storing two bits of information per molecule. In a particularly preferred molecule, $J^1$ and $J^2$ are the same and $Q^1$ and $Q^2$ are the same.

The storage medium is electrically coupled to the electrode(s) by any of a number of convenient methods including, but not limited to, covalent linkage (direct or through a linker), ionic linkage, non-ionic "bonding", simple juxtaposition/apposition of the storage medium to the electrode(s), or simple proximity to the electrode(s) such that electron tunneling between the medium and the electrode(s) can occur. The storage medium can contain or be juxtaposed to or layered with one or more dielectric material(s). Preferred dielectric materials are imbedded with counterions (e.g. Nafion® fluoropolymer). The storage cells of this invention are fully amenable to encapsulation (or other packaging) and can be provided in a number of forms including, but not limited to, an integrated circuit or as a component of an integrated circuit, a non-encapsulated "chip", etc. In some embodiments, the storage medium is electronically coupled to a second electrode that is a reference electrode. In certain preferred embodiments, the storage medium is present in a single plane in the device. The apparatus of this invention can include the storage medium present at a multiplicity of storage locations, and in certain configurations, each storage location and associated electrode(s) forms a separate storage cell. The storage medium may be present on a single plane in the device (in a two dimensional or sheet-like device) or on multiple planes in the device (in a three-dimensional device). Virtually any number (e.g., 16, 32, 64, 128, 512, 1024, 4096, etc.) of storage locations and storage cells can be provided in the device. Each storage location can be addressed by a single electrode or by two or more electrodes. In other embodiments, a single electrode can address multiple storage locations and/or multiple storage cells.

In preferred embodiments, one or more of the electrode(s) is connected to a voltage source (e.g. output of an integrated circuit, power supply, potentiostat, microprocessor (CPU), etc.) that can provide a voltage/signal for writing, reading, or refreshing the storage cell(s). One or more of the electrode (s) is preferably connected to a device (e.g., a voltammetric device, an amperometric device, a potentiometric device, etc.) to read the oxidation state of said storage medium. In particularly preferred embodiments, the device is a sinusoidal voltammeter. Various signal processing methods can be provided to facilitate readout in the time domain or in the frequency domain. Thus, in some embodiments, the readout device(s) provide a Fourier transform (or other frequency analysis) of the output signal from said electrode. In certain preferred embodiments, the device refreshes the oxidation state of said storage medium after reading said oxidation state.

Particularly preferred methods and/or devices of this invention utilize a "fixed" electrode. Thus, in one embodiment, methods and/or devices in which the electrode (s) are moveable (e.g. one or more electrodes is a "recording head", the tip of a scanning tunneling microscope (STM), the tip of an atomic force microscope (AFM), or other forms in which the electrode is movable with respect to the storage medium are excluded. Similarly in certain embodiments, methods and/or devices and/or storage media, in which the storage molecules are responsive to light and/or in which the oxidation state of a storage molecule is set by exposure to light are excluded.

In another embodiment, this invention provides an information storage medium. The information storage medium can be used to assemble storage cells and/or the various memory devices described herein. In a preferred embodiment the storage medium comprises one or more different storage molecules. When different species of storage molecule are present, each species of storage molecule oxidation state(s) is different from and distinguishable from the oxidation state(s) of the other species of storage molecule comprising the storage medium.

This invention also provides particularly preferred molecules for the storage of information (storage molecules). The molecules preferably have at least one non-neutral oxidation state and more preferably have at least two different and distinguishable non-neutral oxidation states. In various preferred embodiments, the storage molecules include any of the storage molecules as described herein.

This invention also provides methods of storing data. The methods involve i) providing an apparatus, e.g., comprising one or more storage cells as described herein; and ii) applying a voltage to the electrode at sufficient current to set an oxidation state of said storage medium (the storage medium comprising one or more storage cells). In preferred embodiments, the voltage range is less than about 5 volts, more preferably less than about 2 volts, and most preferably less than about 1 or less than about 0.5 volts. The voltage can be the output of any convenient voltage source (e.g. output of an integrated circuit, power supply, logic gate, potentiostat, microprocessor (CPU), etc.) that can provide a voltage/signal for writing, reading, or refreshing the storage cell(s).

The method can further involve detecting the oxidation state of the storage medium and thereby reading out the data stored therein. The detection (read) can optionally involve refreshing the oxidation state of the storage medium. The read (detecting) can involve analyzing a readout signal in the time or frequency domain and can thus involve performing a Fourier transform on the readout signal. The detection can be by any of a variety of methods including, but not limited to a voltammetric method.

This invention additionally provides the memory devices of this invention (e.g. memory cells) in a computer system. In addition computer systems utilizing the memory devices of this invention are provided. Preferred computer systems include a central processing unit, a display, a selector device, and a memory device comprising the storage devices (e.g. storage cells) of this invention.

DETAILED DESCRIPTION OF THE PREFERRED EMBODIMENTS

Figure 1:
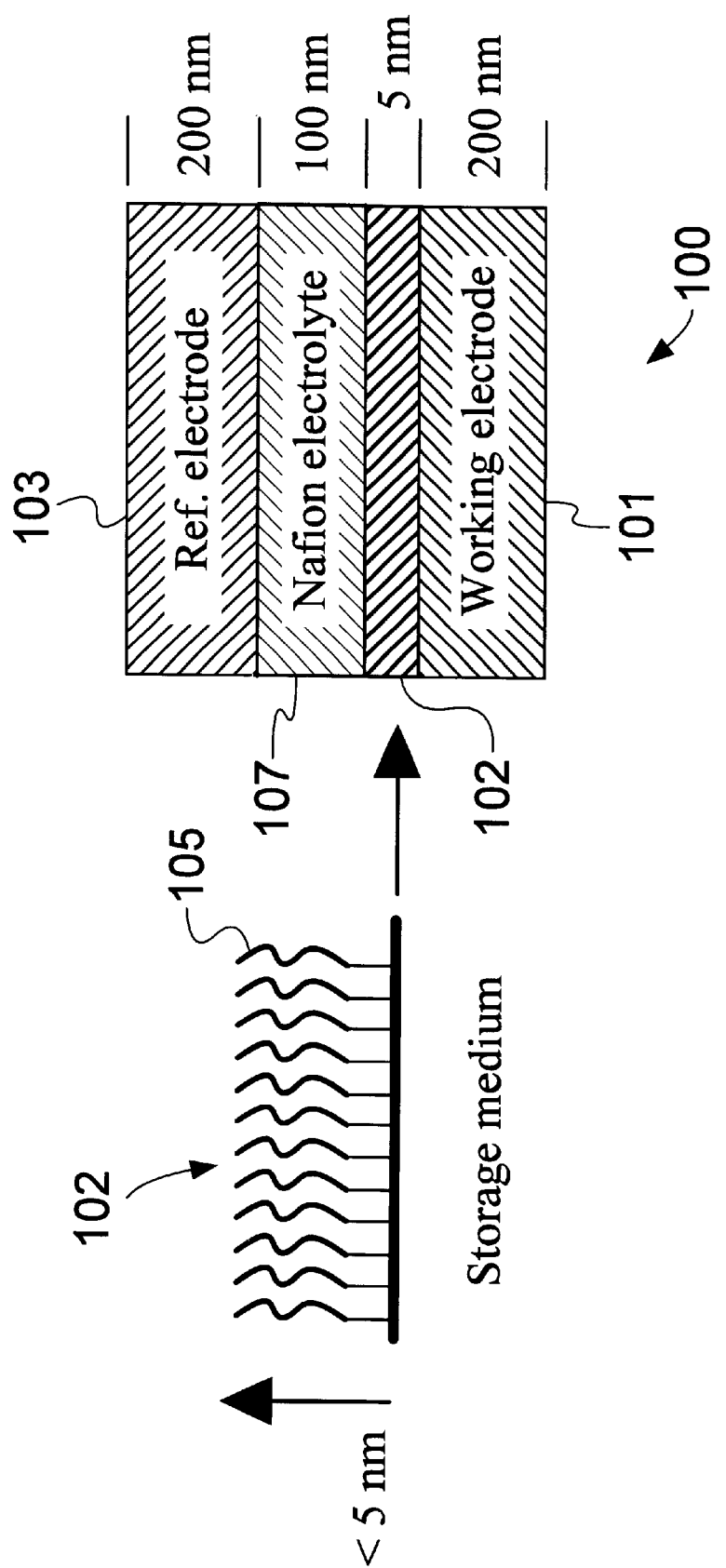
FIG. 1 illustrates a basic molecular memory unit "storage cell" of the present invention.

As noted above, this invention provides novel high density memory devices that are electrically addressable permitting effective reading and writing, that provide a high memory density (e.g., $10^{15}$ bits/cm$^3$), that provide a high degree of fault tolerance, and that are amenable to efficient chemical synthesis and chip fabrication.

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}$ (aq)→>$Fe^3$ (aq)+$e^-$ because electrons are lost from the species being oxidized, $Fe^2$+ (aq), despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The term "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g. 0° C. to about 40° C.).

The term "electrode" refers to any medium capable of transporting charge (e.g. electrons) to and/or from a storage molecule. Preferred electrodes are metals or conductive organic molecules. The electrodes can be manufactured to virtually any 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit" or "redox-active subunit" refers to a molecule or component of a molecule that is capable of being oxidized or reduced by the application of a suitable voltage.

The term "subunit", as used herein, refers to a redox-active component of a molecule.

The terms "storage molecule" or "memory molecule" refer to a molecule having one or more oxidation states that can be used for the storage of information (e.g. a molecule comprising one or more redox-active subunits). Preferred storage molecules have two or more different and distinguishable non-neutral oxidation states. In addition to the compounds of Formula I herein, a wide variety of additional molecules can be used as storage molecules and hence further comprise the storage medium. Preferred molecules include, but are not limited to a porphyrinic macrocycle, a metallocene, a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. Even more preferred molecules include a porphyrin, an expanded porphyrin, a contracted porphyrin, a ferrocene, a linear porphyrin polymer, and porphyrin array. Certain particularly preferred storage molecules include a porphyrinic macrocycle substituted at a β-position or at a meso-position. Molecules well suited for use as storage molecules include the molecules described herein.

The term "storage medium" refers to a composition comprising a storage molecule of the invention, preferably bonded to a substrate.

The term "electrochemical cell" consists minimally of a reference electrode, a working electrode, a redox-active medium (e.g. a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

Addressing a particular element refers to associating (e.g., electrically coupling) that memory element with an electrode such that the electrode can be used to specifically determine the oxidation state(s) of that memory element.

The term "storage density" refers to the number of bits per volume and/or bits per molecule that can be stored. When the storage medium is said to have a storage density greater than one bit per molecule, this refers to the fact that a storage medium preferably comprises molecules wherein a single molecule is capable of storing at least one bit of information.

The terms "read" or "interrogate" refer to the determination of the oxidation state(s) of one or more molecules (e.g. molecules comprising a storage medium).

The term "refresh" when used in reference to a storage molecule or to a storage medium refers to the application of a voltage to the storage molecule or storage medium to re-set the oxidation state of that storage molecule or storage medium to a predetermined state (e.g. an oxidation state the storage molecule or storage medium was in immediately prior to a read).

The term "$E_{1/2}$" refers to the practical definition of the formal potential (B°) of a redox process as defined by B−B°+ (RT/nF)ln($D_{ox}/D_{red}$) where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

A voltage source is any source (e.g. molecule, device, circuit, etc.) capable of applying a voltage to a target (e.g. an electrode).

The term "present on a single plane", when used in reference to a memory device of this invention refers to the fact that the component(s) (e.g. storage medium, electrode (s), etc.) in question are present on the same physical plane in the device (e.g. are present on a single lamina). Components that are on the same plane can typically be fabricated at the same time, e.g., in a single operation. Thus, for example, all of the electrodes on a single plane can typically be applied in a single (e.g., sputtering) step (assuming they are all of the same material).

The phrase "output of an integrated circuit" refers to a voltage or signal produced by one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific field potential ("voltage").

A potentiometric device is a device capable of measuring potential across an interface that results from a difference in the equilibrium concentrations of redox molecules in an electrochemical cell.

A "coulometric device" is a device capable of measuring the net charge produced during the application of a potential field ("voltage") to an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, subphthalocyanines, and porphyrin isomers). Preferred porphyrinic macrocycles comprise at least one 5-membered ring.

The term porphyrin refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

A linker is a molecule used to couple two different molecules, two subunits of a molecule, or a molecule to a substrate.

A substrate is a, preferably solid, material suitable for the attachment of one or more molecules. Substrates can be formed of materials including, but not limited to glass, plastic, silicon, minerals (e.g. quartz), semiconducting materials, ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl ($C_6H_5$) or naphthyl ($C_{10}H_7$). It is recognized that the aryl, while acting as substituent can itself have additional substituents (e.g. the substituents provided for $S_n$ in the various formulas herein).

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3$)$_2$CH—).

The term "halogen" refers to one of the electronegative elements of group VIIA of the periodic table (fluorine, chlorine, bromine, iodine, astatine).

The term "nitro" refers to the —$NO_2$ group.

The term "amino" refers to the —$NH_2$ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CR unit is replaced with a nitrogen atom.

The term "cyano" refers to the —CN group.

The term "thiocyanato" refers to the —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R^1(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbamoyl, etc.

The term "amido" refers to the group of composition $R^1 CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In preferred embodiments, when a metal is designated by "M" or "M$^n$", where n is an integer, it is recognized that the metal may be associated with a counterion.

The term "substituent" as used in the formulas herein, particularly designated by S or $S_n$ where n is an integer, in a preferred embodiment refer to redox-active groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In preferred embodiments, a substituted aryl group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

Particularly preferred substituents include, but are not limited to, 4-chlorophenyl, 3-acetamidophenyl, 2,6-dichloro-4-trifluoromethyl. Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

One embodiment of this invention is illustrated in FIG. 1. The basic memory device, a "storage cell" 100 comprises a working electrode 101 electrically coupled to a storage medium 102 comprising a multiplicity of storage molecules 105. The storage cell optionally includes an electrolyte 107 and a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons. Each oxidation state may be used to represent a particular bit.

The storage medium may remain in the set oxidation state until another voltage is applied to alter that oxidation state, can be refreshed, or can be allowed to dissipate over time. The oxidation state of the storage medium can be readily determined using a wide variety of electronic (e.g. amperometric, coulometric, voltammetric) methods thereby providing rapid readout.

The storage medium comprises molecules having a single oxidation state and/or molecules having multiple different and distinguishable non-neutral oxidation states. Thus, for example, in one embodiment, the storage medium can comprise eight different species of storage molecules each having one non-neutral oxidation state and thereby store one byte. In another embodiment, the storage medium can comprise one species of molecule that has eight different and distinguishable oxidation states and store one byte in that manner as well. As explained herein, a large number of different molecules having different numbers of oxidation states can be used for the storage medium.

Because molecular dimensions are so small (on the order of angstroms) and individual molecules in the devices of this invention can store multiple bits, the storage devices of this invention therefore offer remarkably high storage densities (e.g.>$10^{15}$ bits/cm$^3$).

Moreover, unlike prior art, the devices of this invention are capable of a degree of self-assembly and hence easily fabricated. Because the devices are electrically (rather than optically) addressed, and because the devices utilize relatively simple and highly stable storage elements, they are readily fabricated utilizing existing technologies and easily incorporated into electronic devices. Thus, the molecular memory devices of this invention have a number of highly desirable features:

Because the storage medium of the devices described herein is electrically-addressed, the devices are amenable to the construction of a multilayered chip architecture. An architecture compatible with such a three-dimensional structure is essential to achieve the objective of $10^{15}$ bits/cm$^3$. In addition, because writing and reading is accomplished electrically, many of the fundamental problems inherent with photonics are avoided. Moreover, electrical reading and writing is compatible with existing computer technology for memory storage.

In addition, the devices of this invention achieve a high level of defect tolerance. Defect tolerance is accomplished through the use of clusters of molecules (up to several million in a memory cell). Thus, the failure of one or a few molecules will not alter the ability to read or write to a given memory cell that constitutes a particular bit of memory. In preferred embodiments, the basis for memory storage relies on the oxidation state(s) of porphyrins or other porphyrinic macrocycles of defined energy levels. Porphyrins and porphyrinic macrocycles are well known to form stable radical cations. Indeed, the oxidation and reduction of porphyrins provide the foundation for the biological processes of photosynthesis and respiration. Porphyrin radical cations can be formed chemically on the benchtop exposed to air. We know of no other class of molecules with such robust electroactive properties.

Preferred storage molecules of this invention molecule can hold multiple holes, corresponding to multiple bits. In contrast, the dyes (photochromic, electrochromic, redox) and molecular machines are invariably bistable elements. Bistable elements exist either in a high/low state and hence can only store a single bit.

Reading can be accomplished non-destructively or destructively as required in different chip applications. The speed of reading is conservatively estimated to lie in the MHz to GHz regime. Oxidation of the porphyrins or other porphyrinic macrocycles can be achieved at relatively low potential (and at predesignated potentials through synthetic design), enabling memory storage to be achieved at very low power. Porphyrins and porphyrin radical cations are stable across a broad range of temperatures, enabling chip applications at low temperature, room temperature, or at elevated temperatures.

Fabrication of the devices of this invention relies on known technology. The synthesis of the storage media takes advantage of established building block approaches in porphyrin and other porphyrinic macrocycle chemistry. Synthetic routes have been developed to make the porphyrin and porphyrinic macrocycle building blocks, to join them in covalent nanostructures, and to purify them to a high level (>99%).

In preferred embodiments, the storage medium nanostructures are designed for directed self-assembly on gold surfaces. Such self-assembly processes are robust, result in the culling out of defective molecules, and yield long-range order in the surface-assembled cluster.

Porphyrin-thiols have been assembled on electroactive surfaces. The arrays that define the addressable bits of memory can be achieved through conventional microfabrication techniques. The storage molecules are self-assembled onto these electrode arrays and attached to the gold surface using conventional dipping methods.

I. Uses of the Storage Device.

One of ordinary skill in the art will appreciate that the memory devices of this invention have wide applicability in specialized and general-purpose computer systems. Of course commercial realization of the device(s) will be facilitated by the adoption of computer architecture standards compatible with this technology. In addition, commercial adoption of this technology will be facilitated by the use of other molecular electronic components that will serve as on-chip buffers and decoders (that is, molecular logic gates), and the like. In addition, commercialization will be facilitated by the development of a full manufacturing infrastructure.

Regardless, prior to the development of a fully integrated design and manufacturing platform for molecular electronic information storage and transfer, even early generation prototype molecular memory devices described herein have utility in a variety of personal or industrial applications. For example, a prototype 1024/512-bit molecular memory device has sufficient capacity to hold a substantial base of personal and/or other proprietary information. This information could be transported anywhere in the world virtually undetected owing to the extremely small size of the device. If detected, the memory device is easily erased simply by applying a low potential reverse bias current across all memory cells. This protection mechanism can be readily incorporated into any type of transport architecture designed for the memory device.

Among other things, the memory devices of this invention have sufficient capacity to hold information that could be used in a wide assortment of personal digital assistants or other types of "smart cards". Even a memory device that degrades upon multiple read cycles is extremely useful if the number of read cycles is highly limited (perhaps only one). A memory device that degrades upon multiple read cycles or simply with time is also useful in applications where long-term data persistence is not needed. Thus, numerous applications for early generation memory devices present themselves. Successes of the memory devices in these applications will foster even more rapid full-scale commercialization of the technology.

II. Architecture of the Storage Device.

Figure 2:
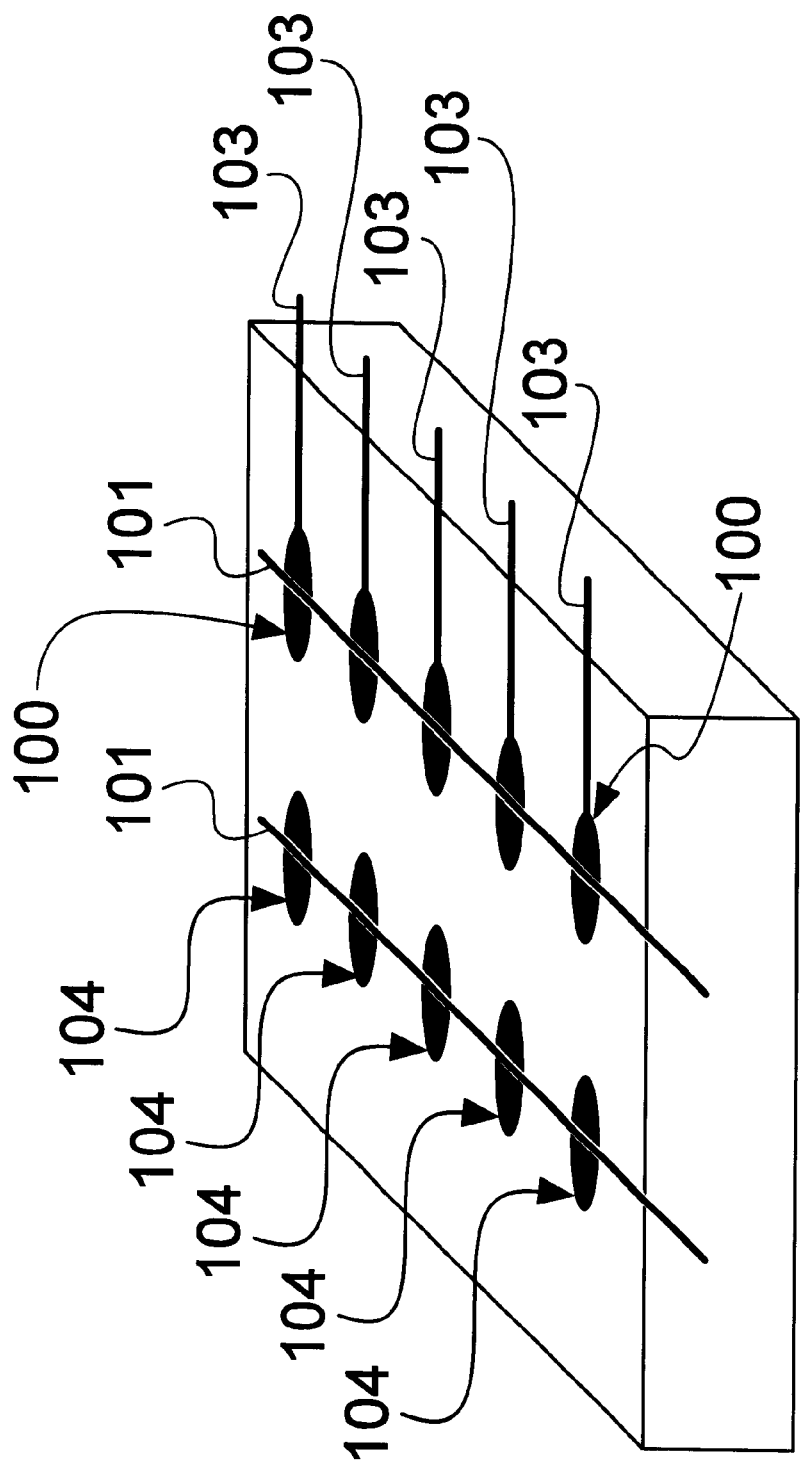
FIG. 2 illustrates the disposition of the storage cell(s) of the invention on a chip.

The basic storage cell (electrode(s) and storage medium) of this invention can be incorporated into a functional device in a wide variety of configurations. One chip-based embodiment of this invention is illustrated in FIG. 2. As illustrated in FIG. 2 the storage medium 102 is disposed in a number of storage locations 104. Each storage location is addressed by a working electrode 101 and a reference electrode 103 so that the storage medium 102 combined with the electrodes forms a storage cell 100 at each storage location.

Figure 3:
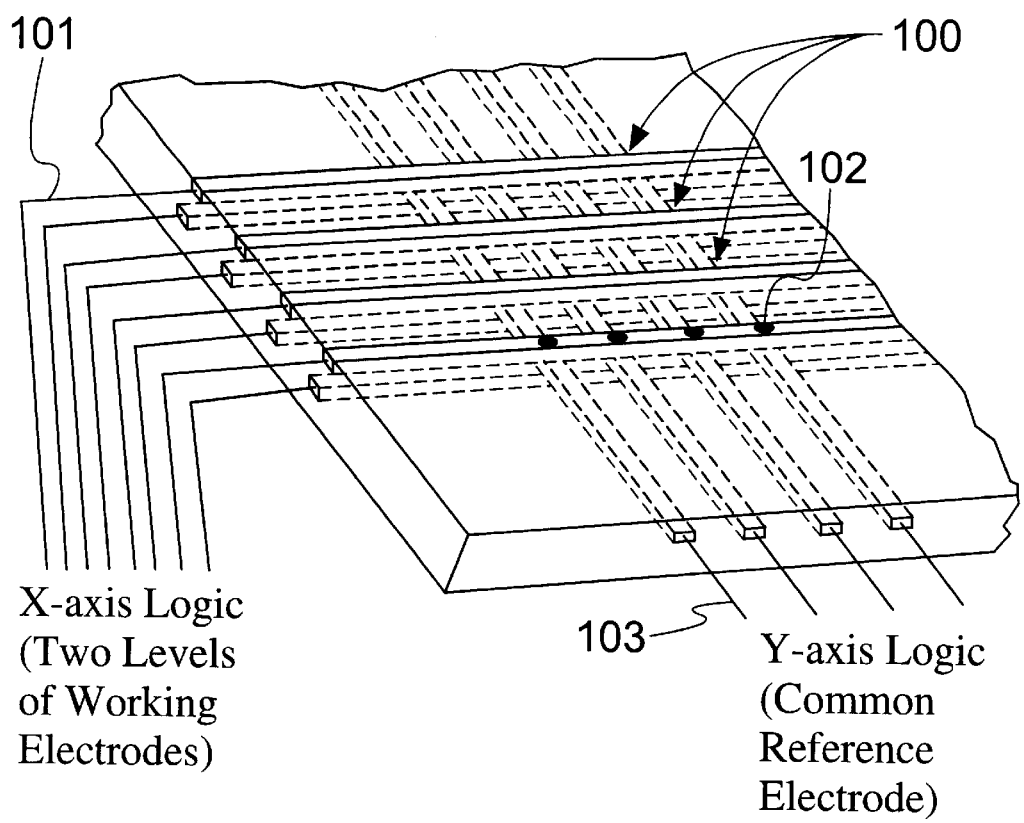
FIG. 3 illustrates a preferred chip-based embodiment of this invention. A two-level chip is illustrated showing working electrodes 101, orthogonal reference electrodes 103, and storage elements 104.

One particularly preferred chip-based embodiment is illustrated in FIG. 3. In the illustrated embodiment, a plurality of working electrodes 101 and reference electrodes 103 are illustrated each addressing storage media 102 localized at discrete storage locations thereby forming a plurality of storage cells 100. Multiple storage cells can be associated with a single addressing electrode as long as oxidation states of the storage cells are distinguishable from each other. It should be noted that this forms a finctional definition of a storage cell. Where two discrete areas of storage medium are addressed by the same electrode(s) if the storage media comprise the same species of storage molecule the two discrete areas will functionally perform as a single storage cell, i.e. the oxidation states of both locations will be commonly set, and/or read, and/or reset. The added storage location, however, will increase the fault tolerance of the storage cell as the finctional storage cell will contain more storage molecules. In another embodiment, each individual storage cell is associated with a single addressing electrode.

In preferred embodiments, the storage medium comprising the storage cells of a memory device are all electrically coupled to one or more reference electrodes. The reference electrode(s) can be provided as discrete electrodes or as a common backplane.

The chip illustrated in FIG. 3 has two levels of working electrodes and hence two levels of storage cells 100 (with numerous storage cells on each level). Of course, the chip can be fabricated with a single level of electrodes and memory element or literally hundreds or thousands of different levels of storage cell(s), the thickness of the chip being limited essentially by practical packaging and reliability constraints.

In particularly preferred embodiments, a layer of dielectric material optionally imbedded with counterions to ensure electrical connectivity between the working and reference electrode(s) and stability of the cationic species in the absence of applied potential (latching) is disposed in the storage cell. In some embodiments, the dielectric material can be incorporated into the storage medium itself.

While, in some preferred embodiments, feature sizes are rather large (e.g. memory elements approximately (10×10× 10 µm) and electrode thickness ~200 nm, feature size can be reduced at will so that feature sizes are comparable to those in conventional silicon-based devices (e.g., 50 nm–100 nm on each axis).

Figure 4:
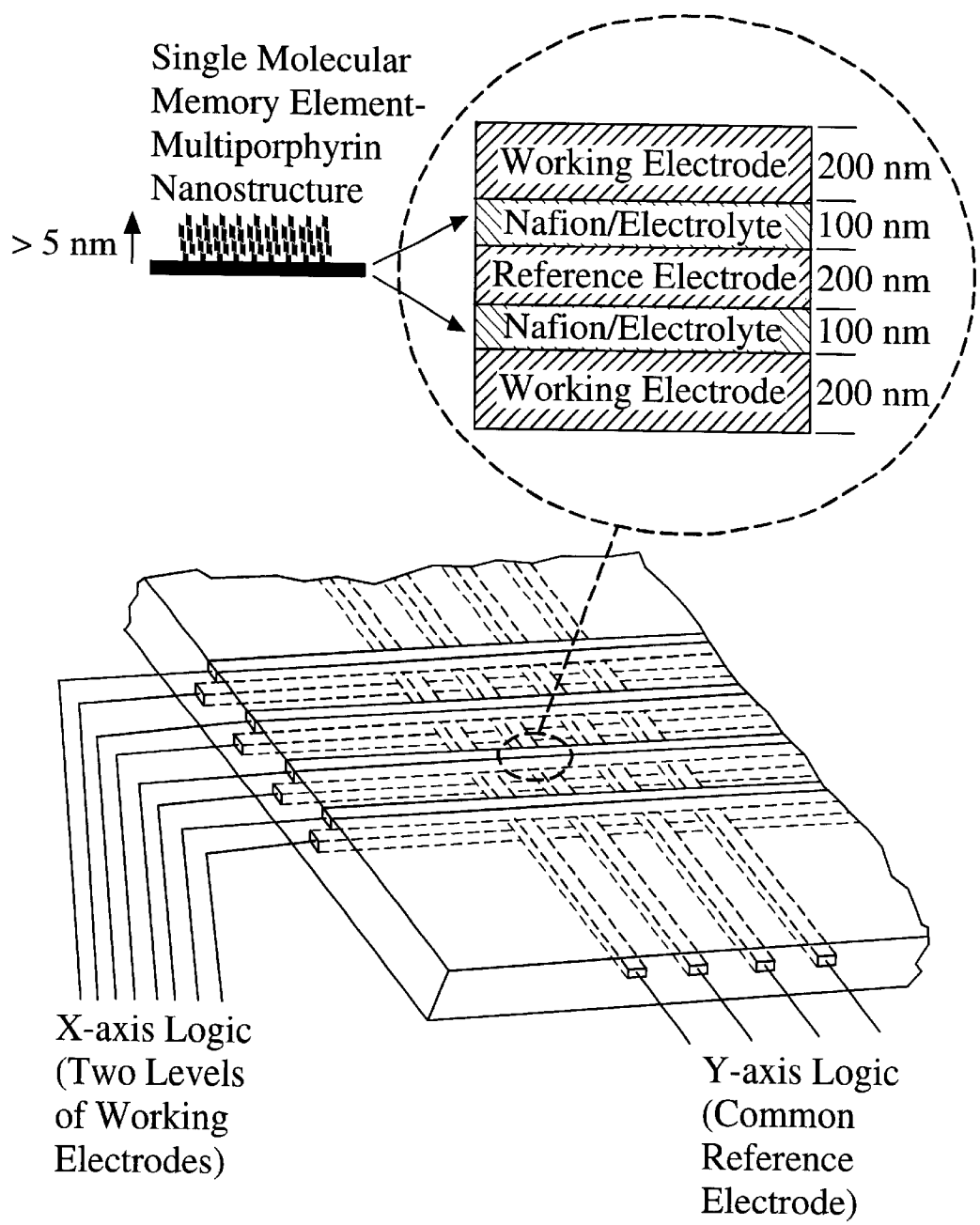
FIG. 4 illustrates the three-dimensional architecture of a single memory storage cell (memory element) on the chip.

In a preferred embodiment, the storage device includes: (1) A gold working electrode (e.g., 200 nm thick), deposited on a nonconducting base, and line-etched to achieve electrode widths of 10's to 100's of nm. (2) A monolayer of self-assembled porphyrinic nanostructures (storage molecules 105) attached to the gold surface via the sulfur atom of the m-thiomethylphenyl group. (3) A 100-nm thick layer of dielectric material 107 embedded with counterions to ensure electrical connectivity to the reference electrode and stability of the cationic species in the absence of applied potential (latching). (4) A 200-nm thick nonpolarizable reference electrode 103 line-etched in the same fashion as those of the working electrode 101, but assembled with lines orthogonal to the latter electrode. (5) A mirror image construct that utilizes the same reference electrode. Thus, in one embodiment, the three-dimensional architecture of a single memory storage location (memory element) on the chip will look as indicated in FIG. 4.

While the discussion herein of electrodes is with respect to gold electrodes, it will be recognized that numerous other materials will be suitable. Thus, electrode materials include, but are not limited to gold, silver, copper, other metals, metal alloys, organic conductors (e.g. doped polyacetylene, doped polythiophene, etc.), nanostructures, crystals, etc.

Similarly, the substrates used in the fabrication of devices of this invention include, but are not limited to glasses, silicon, minerals (e.g. quartz), plastics, ceramics, membranes, gels, aerogels, and the like.

III. Fabrication and Characterization of the Storage Device

A. Fabrication

The memory devices of this invention can be fabricated using standard methods well known to those of skill in the art. In a preferred embodiment, the electrode layer(s) are applied to a suitable substrate (e.g. silica, glass, plastic, ceramic, etc.) according to standard well known methods (see, e.g., Choudhury (1997) *The Handbook of Microlithography, Micromachining, and Microfabrication*, Soc. Photo-Optical Instru. Engineer, Bard & Faulkner (1997) *Fundamentals of Microfabrication*). In addition, examples of the use of micromachining techniques on silicon or borosilicate glass chips can be found in U.S. Pat. Nos. 5,194,133, 5,132,012, 4,908,112, and 4,891,120.

In one preferred embodiment a metal layer is beam sputtered onto the substrate (e.g., a 10 nm thick chromium adhesion layer is sputtered down followed by a 200 nm thick layer of gold). Then maskless laser ablation lithography (see below, performed e.g., with a Nd:YAG laser, is used to create features with micron dimensions, or with an excimer laser to create features of nanometer dimensions) will create an array of parallel lines of conductor (e.g., gold), used as the working electrodes with dimensions ranging between a few microns to tens of nanometers).

Once the electrode array is formed, the entire array, or portions of the array, or individual electrodes are wetted (e.g. immersed or spotted) with one or more solutions of the appropriate derivatized storage media (e.g. thiol-substituted porphyrin nanostructures), and the constituents of the memory medium (e.g., monomeric porphyrin subunits) self-assemble on the micro-sized gold arrays to form the memory elements. It will be appreciated that different solutions can be applied to different regions of the electrode array to produce storage cells comprising different storage media. Methods of spotting different reagents on surfaces (e.g. on glass surfaces) at densities up to tens of thousands of different species/spots per $cm^2$ are known (see, e.g., U.S. Pat. No: 5,807,522).

Then a suitable electrolyte layer (e.g. a thin layer of Nafion polymer) approximately 1 nm to 1000 nm, preferably about 100 nm to about 500 nm, more preferably about 10 nm to about 100 nm and most preferably about one hundred nanometers thick) will be cast over the entire surface of the chip. This polymer serves to hold the electrolyte for electrochemical reaction. Finally, the entire chip is coated with a layer (e.g., 10 nm to about 1000 nm, more preferably 100 nm to about 300 nm and most preferably about 200 nm of conducting material (e.g. silver) which acts as a reference electrode 103.

The chip is then turned 90 degrees, and maskless laser ablation lithography will be performed again to create a second array of parallel lines that are perpendicular to the original set. This forms a three dimensional array of individual memory elements, where each element is formed by the intersection of these two perpendicular linear arrays (see FIG. 4).

Each individual element can be addressed by selecting the appropriate X and Y logic elements, corresponding to one gold working electrode and one reference electrode separated by the Nafion® polymer/electrolyte layer. Since this structure is inherently three dimensional, it should be possible to extend the array into the Z-direction, creating a 3-D array of memory elements as large as it is feasible to connect to.

These structures are initially created on the micron scale. It is possible to decrease the size of these structures to sub-micron dimensions. It is possible to create these structures on a scale similar to silicon microstructures created with conventional nanolithographic techniques (i.e. 100–200 nm). This would allow the interfacing of the memory elements with conventional silicon-based semiconductor electronics.

In the laser-ablation lithography discussed above, coherent light is sent through a beam splitter (50% transmittance) and reflected by a mirror to make two nearly parallel identical beams (Rosenwald et al. (1998) *Anal. Chem.*, 70: 1133–1140). These beams are sent through e.g., a 50 cm focal length lens for ease in focusing to a common point. The placement of the beams is fine-tuned to allow complete overlap of the mode structure of the laser spot. Higher order interference patterns are minimized through the use of high quality optics (1/10 wave surface flatness). This ensures that the variation between intensity maxima and minima in the first order will be several orders of magnitude larger than those formed with second and higher orders. This produces a well-defined pattern of lines across the electrode surface, where the spacing between points of positive interference (D) can be approximated by the Bragg Equation: $n\lambda=2D\sin(\theta/2)$, where $\lambda$=wavelength, $\theta$=angle between the beams, and n is order. For example, when a Nd:YAG is used at 1064 nm, the recombination of the two beams in this manner generates an interference pattern with ~2 micron spacing when the angle between the 2 beams is 15°. The interference pattern spacing can easily be changed by modifying the angle between the beams. Attenuation of the beam was accomplished by inserting one or more neutral density filters before the beam splitter. In this way, the exposure of the gold layer to the Nd-YAG interference pattern can be performed at different beam attenuations to produce power densities between 1 and 100 $MW/cm^2$.

B. Electrically Coupling Storage Medium to Electrode

In the storage devices of this invention, the storage medium is electrically coupled to one or more electrodes. The term "electrical coupling" is used to refer to coupling schemes that permit the storage medium to gain or lose electrons to the electrode. The coupling can be a direct attachment of the storage medium to the electrode, or an indirect attachment (e.g. via a linker). The attachment can be a covalent linkage, an ionic linkage, a linkage driven by hydrogen bonding or can involve no actual chemical attachment, but simply a juxtaposition of the electrode to the storage medium. In some embodiments, the electrode can be some distance (e.g. about 5 Å to about 50 Å) from the storage medium and electrical coupling can be via electron tunneling.

In some preferred embodiments, a "linker" is used to attach the molecule(s) of the storage medium to the electrode. The linker can be electrically conductive or it can be short enough that electrons can pass directly or indirectly between the electrode and a molecule of the storage medium.

The manner of linking a wide variety of compounds to various surfaces is well known and is amply illustrated in the literature. Means of coupling the molecules comprising the storage medium will be recognized by those of skill in the art. The linkage of the storage medium to a surface can be covalent, or by ionic or other non-covalent interactions. The surface and/or the molecule(s) may be specifically derivatized to provide convenient linking groups (e.g. sulfur, hydroxyl, amino, etc.).

The linker can be provided as a component of the storage medium molecule(s) or separately. Linkers, when not joined to the molecules to be linked are often either hetero- or homo-bifunctional molecules that contain two or more reactive sites that may each form a covalent bond with the respective binding partner (i.e. surface or storage medium molecule). When provided as a component of a storage molecule, or attached to a substrate surface, the linkers are preferably spacers having one or more reactive sites suitable for bonding to the respective surface or molecule.

Linkers suitable for joining molecules are well known to those of skill in the art and include, but are not limited to any of a variety of, a straight or branched chain carbon linker, or a heterocyclic linker, amino acid or peptide linkers, and the like. Particularly preferred linkers include, but are not limited to 4,3'-diphenylethyne, 4,3'-diphenylbutadiyne, 4,3'-biphenyl, 1,3-phenylene, 4,3'-stilbene, 4,3'-azobenzene, 4,3'-benzylideneaniline, and 4,3"-terphenyl. Linkers include molecules that join one or more molecules of the storage medium to the electrode(s).

C. Addressing the Memory Cells

Addressing of the storage cell(s) in the devices of this invention is relatively straightforward. In a simple approach a discrete pair of electrodes (one working and one reference electrode) can be connected to every storage cell. Individual reference electrodes, however are not required and can be replaced with one or more common reference electrodes connected to all or to a subset of all of the storage elements in a particular device. Alternatively, the common reference electrodes can be replaced with one or more conductive "backplanes" each communicating to all, or to a subset, of the storage cells in a particular device.

Where the storage cells contain identical storage media, each storage cell is preferably addressed with a separate working electrode so that the storage (oxidation) states of the storage cells can be distinguished from each other. Where the storage cells contain different storage media such that the oxidation states of one storage cell are different and distinguishable from the oxidation states of another storage cell, the storage cells are preferably addressed by a common working electrode thereby reducing the number of electrodes in a device.

In one preferred embodiment, the storage devices of this invention contain 64, 128, 256, 512, 1024 or more storage locations per layer (64, 128, 256, 512, 1024 or more locations in the mirror image architecture) with each location capable of holding a two bit word. Accordingly, a preferred 1024-bit or a preferred 512-bit chip will contain 8 wiring interconnects on each of the three electrode grids in the 3-dimensional architecture illustrated in FIG. 4.

D) Characterization of the Memory Device

The performance (e.g. operating characteristics) of the memory devices of this invention is characterized by any of a wide variety of methods, most preferably by electrochemical methods (amperometry and sinusoidal voltammetry, see, e.g., Howell et al. (1986) *Electroanal. Chem.*, 209: 77–90; Singhal and Kuhr. (1997) *Anal. Chem.*, 69: 1662–1668; Schick et al. (1989) *J. Am. Chem. Soc.* 111:1344–1350), atomic force microscopy, electron microscopy and imaging spectroscopic methods. Surface-enhanced resonance and Raman spectroscopy are also used to examine the storage medium on the electrodes.

Among other parameters, characterization of the memory devices (e.g., memory cells) involves determining the number of storage medium molecules (e.g., porphyrin arrays) required for defect-tolerant operation. Defect tolerance includes factors such as reliably depositing the required number of holes to write the desired digit and accurately detecting the numbers/hopping rates of the holes.

The long-term resistance of electron holes to charge-recombination in the solid-phase medium of the device package is also determined. Using these parameters, the device architecture can be optimized for commercial fabrication.

IV. Architecture of the Storage Medium

The storage medium used in the devices of this invention comprises one or more species of storage molecule. A preferred storage medium is characterized by having a multiplicity of oxidation states. Those oxidation states are provided by one or more redox-active units. A redox-active unit refers to a molecule or to a subunit of a molecule that has one or more discrete oxidation states that can be set by application of an appropriate voltage. Thus, for example, in one embodiment, the storage medium can comprise one species of redox-active molecule where that molecule has two or more (e.g. 4) different and distinguishable oxidation states. Where each species of storage molecule has a single, non-neutral, oxidation state, the storage medium achieves multiple bit storage by having a plurality of such molecules where each molecule has a different and distinguishable oxidation state (e.g. each species of molecule oxidizes at a different and distinguishable potential). Of course, each species of molecule preferably has a plurality of different and distinguishable oxidation states.

As indicated above, the storage medium can be broken down into individual, e.g., spatially segregated, storage locations. Each storage element can have a storage medium that is the same or different from the other storage elements in the chip and/or system. Where the storage elements are of identical composition, in preferred embodiments, they are separately addressed so that information in one element can be distinguished from information in another element. Where the storage elements are of different composition they can be commonly addressed (where the oxidation states of the commonly addressed storage elements are distinguishable) or they can be individually addressed.

In certain preferred embodiments the storage medium is juxtaposed to a dielectric medium to insure electrical connectivity to a reference voltage (e.g. a reference electrode, a reference backplane, etc.). In particularly preferred embodiments, a layer of dielectric material is imbedded with counterions to ensure electrical connectivity to the reference electrode and stability of the cationic species in the absence of applied potential (latching) disposed between the reference working electrode(s).

Dielectric materials suitable for the devices of this invention are well known to those of skill in the art. Such materials include, but are not limited to Nafion® polymer, cellulose acetate, polystyrene sulfonate, poly (vinylpyridine), electronically conducting polymers such as polypyrrole and polyaniline, etc.

The porphyrinic macrocycles identified herein are ideally suited for molecular based memory storage. The porphyrinic macrocycles, and especially the porphyrins, have unique electroactive properties, a well-developed modular synthetic chemistry, and in conjunction with thiols, and other linkers described herein, undergo directed self-assembly on electroactive surfaces.

A. Winged Trimer (or "Winged Spider") Storage Molecules

As noted above, the storage media of the present invention preferably comprise and are produced with a winged trimer (or "winged spider") storage molecule. Such molecules generally have the formula I

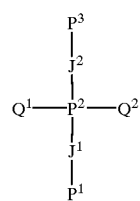

wherein:

$P^1$ and $P^3$ are porphyrinic macrocycles (and are preferably selected to have the same oxidation state);

$P^2$ is a porphyrinic macrocycle selected to have an oxidation state different from $P^1$ and $P^3$;

$J^1$ and $J^2$ are independently selected linkers that permit electron transfer between the porphyrinic macrocycles; and $Q^1$ and $Q^2$ are each independently selected linkers (e.g., protected or unprotected thiol linkers).

In preferred embodiments of the invention, which are relatively simple to synthesize, the molecule of Formula I has four different and distinguishable oxidation states and thus provides a molecule and storage medium that is capable of storing two bits of information per molecule. In a preferred molecule, $J^1$ and $j^2$ are the same and $Q^1$ and $Q^2$ are the same.

Figure 12:
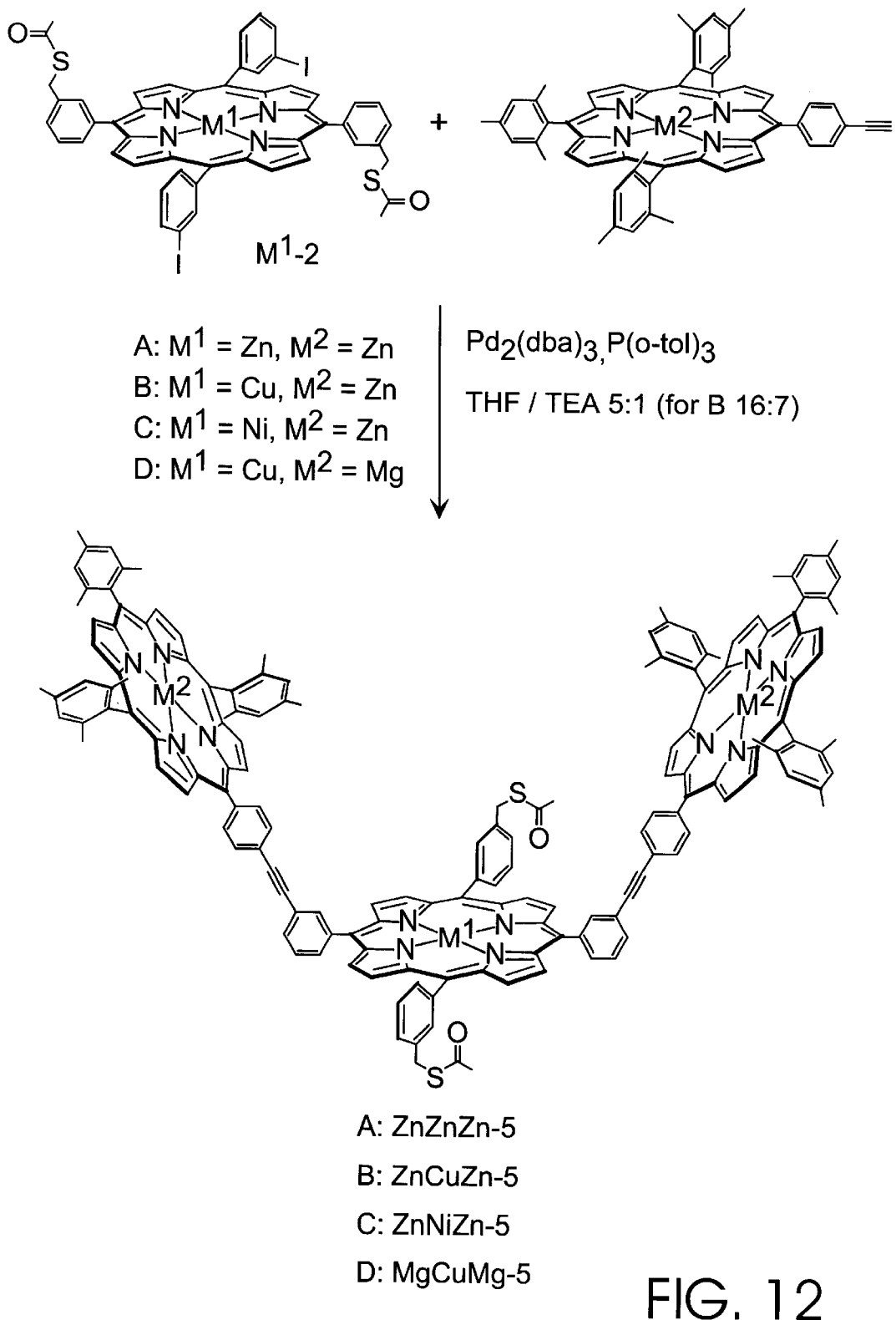
FIG. 12 illustrates the synthesis of trimers ZnZnZn-5, ZnCuZn-5 and Zn-Ni-Zn-5.
Figure 13:
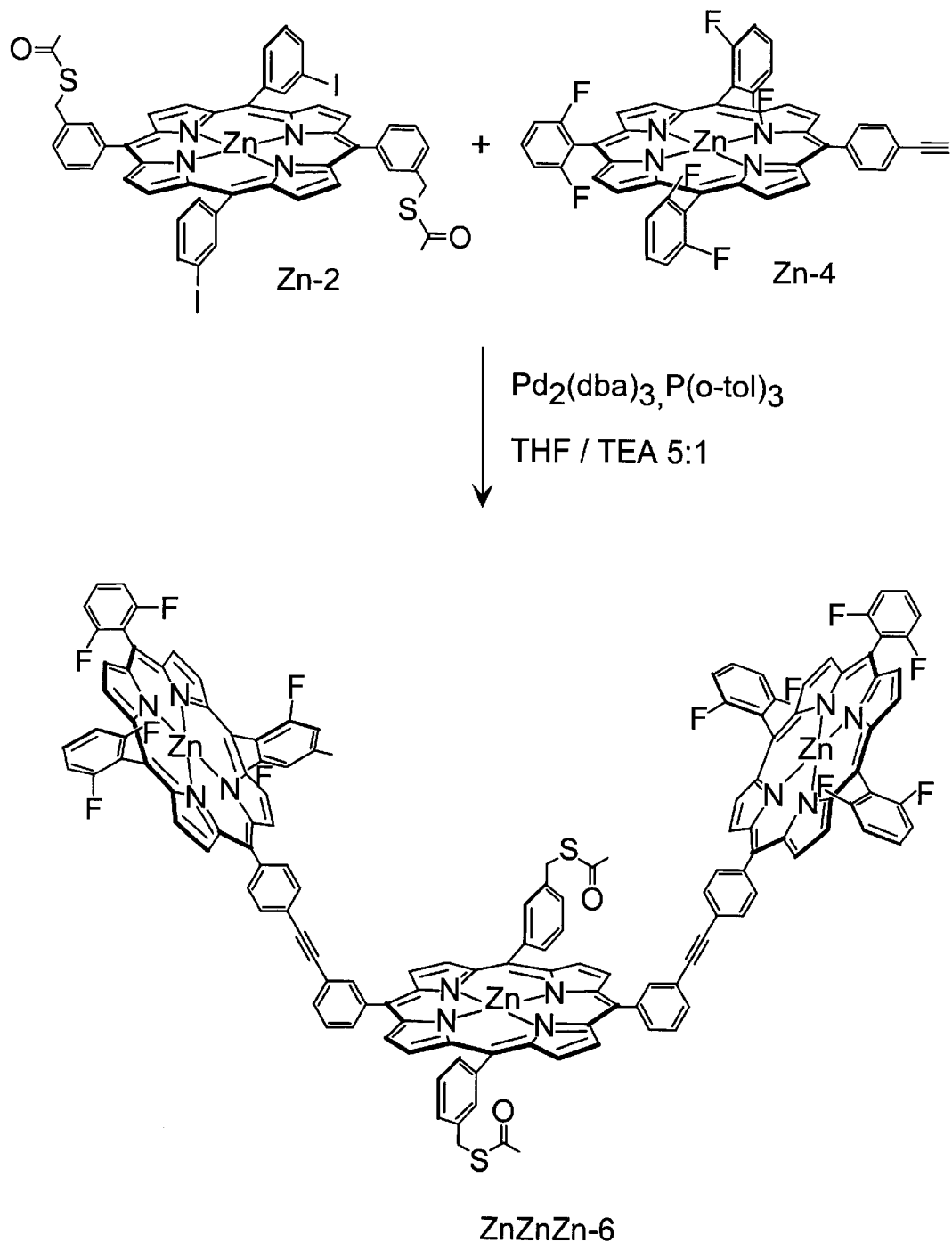
FIG. 13 illustrates the synthesis of trimer ZnZnZn-6 by coupling Zn-2 with Zn-4.

$P_1$ and $P^3$ may be oriented laterally with respect to $P^2$, or may be oriented obliquely with respect to $P^2$ as shown in FIG. 12 and FIG. 13. Such an oblique (or angled) orientation is currently preferred, due to the positioning of "wings" $P^1$ and $P^3$ at a greater distance from the electrode surface when the molecule is adhered or bonded to an electrode. In some embodiments, such molecules provide a storage medium that has a memory storage density of at least about 10 gigabits per $cm^2$ in a sheet-like device.

The molecule may be covalently linked to an electrode or substrate by at least one of $Q^1$ and $Q^2$. In a preferred embodiment, the electrode has a substantially flat planar surface portion, and said storage medium is covalently linked to said electrode surface portion by both of $Q^1$ and $Q^2$ so that porphyrinic macrocycle $P^2$ is positioned substantially horizontally thereto.

In a preferred embodiment, compounds of Formula I have the formula:

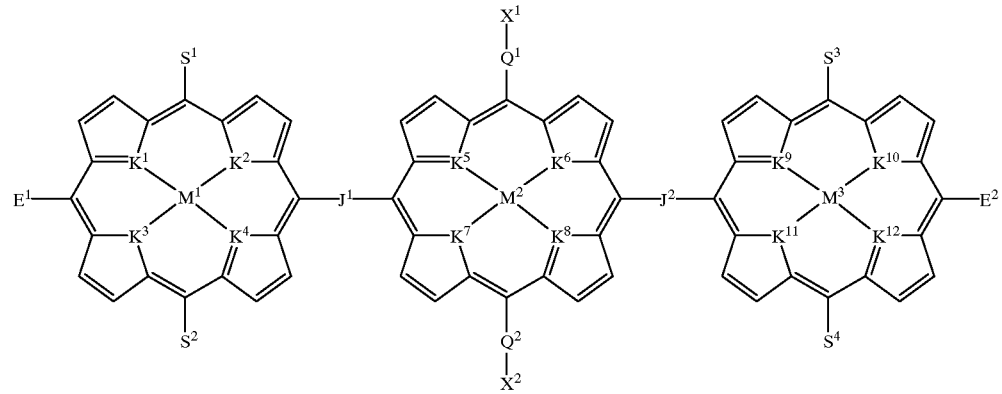

wherein $S^1$, $S^2$, $S^3$, and $S^4$ are independently selected substituents that preferably provide a redox potential of less than about 5, 2 or even 1 volt;

$M^1$, $M^2$, and $M^3$ are independently selected metals;

$K^1$, $K^2$, $K^3$, $K^4$, $K^5$, $K^6$, $K^7$, $K^8$, $K^9$, $K^{10}$, $K^{11}$, and $K^{12}$ are independently selected from the group consisting of N, O, S, Se, Te, and CH;

$J^1$ and $J^2$ are independently selected linkers;

$Q^1$ and $Q^2$ are independently selected linkers;

$X^1$ and $X^2$ are independently selected from the group consisting of a substrate, a reactive site that can covalently couple to a substrate, and a reactive site that can ionically couple to a substrate; and $E^1$ and $E^2$ are independently selected terminating substituents;

In one particularly preferred embodiment of the foregoing, $K^1$, $K^2$, $K^3$, $K^4$, $K^9$, $K^{10}$, $K^{11}$, and $K^{12}$ are the same; $K^5$, $K^6$, $K^7$, and $K^8$, are the same but may be different from $K^1$; $M^1$ and $M^3$ are the same; $M^1$ and $M^2$ are different; $S^1$, $S^2$, $S^3$ and $S^4$ are the same; and $E^1$ and $E^2$ are the same.

In another particularly preferred embodiment of the foregoing, $K^1$, $K^2$, $K^3$, $K^4$, $K^5$, $K^6$, $K^7$, $K^8$, $K^9$, $K^{10}$, $K^{11}$, and $K^{12}$ are all the same; $M^1$ and $M^3$ are the same; $M^1$ and $M^2$ are different; $S^1$, $S^2$, $S^3$ and $S^4$ are the same; and $E^1$ and $E^2$ are the same.

Example substituents $S^1$, $S^2$, $S^3$, and $S^4$ include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Example terminating substituents for $E^1$ and $E^2$ include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylarnino, acyl, sulfoxyl, sulfonyl, imido, amido, and carbamoyl. Such substituents preferably provide a redox potential range of less than about 5, 2 or even 1 volts.

Example metals from which $M^1$, $M^2$, and $M^3$ may be selected include, but are not limited to, Fe, Zn, Mg, Cd, Hg, Cu, Ag, Au, Ni, Pd, Pt, Co, Rh, Ir, Mn, B, Al, Ga, Pb, and Sn. Preferably, $M^1$ and $M^2$ are different, and $M^1$ and $M^3$ are the same.

As indicated above with respect to Formula I, $J^1$ and $J^2$ may be linear linkers or oblique linkers, with oblique linkers currently preferred. Examples of such oblique linkers include, but are not limited to, 4,3'-diphenylethyne, 4,3'-diphenylbutadiyne, 4,3'-biphenyl, 1,3-phenylene, 4,3'stilbene, 4,3'azobenzene, 4,3'-benzylideneaniline, and 4,3''-terphenyl. Examples of linear linkers include, but are not limited to, 4,4'-diphenylethyne, 4,4'-diphenylbutadiyne, 4,4'-biphenyl, 1,4-phenylene, 4,4'stilbene, 1,4-bicyclooctane, 4,4'azobenzene, 4,4'-benzylideneaniline, and 4,4''-terphenyl.

$Q^1$ and $Q^2$ may be linear linkers or oblique linkers, with oblique linkers currently preferred to provide the planar orientation of $P^2$ on the metal surface. $X^1$ and $X^2$ may be protected or unprotected reactive sites on the linkers such as thio, seleno and telluro groups. Thus, examples of oblique linkers for $X^1$—$Q^1$— and $X^2$—$Q^2$ are 3-(2-(4-mercaptophenyl)ethynyl)phenyl, 3-mercaptomethylphenyl, 3-hydro-selenophenyl, 3-(2-(4-hydroselenopenyl)ethynyl) phenyl, 3-hydrotellurophenyl, and 3-(2-(4-hydrotellurophenyl)ethynyl)phenyl. Examples of linear linkers for $X^1$—$Q^1$— and $X^2$—$Q^2$ are 4-(2-(4-mercaptophenyl)ethynyl)phenyl, 4-mercaptomethylphenyl, 4-hydroselenophenyl, 3-(2-(4-hydroselenopenyl)ethynyl) phenyl, 4-hydrotellurophenyl, and 4-(2-(4-hydrotellurophenyl)ethynyl)phenyl.

Preferably, the different and distinguishable oxidation states of the molecule, and a storage medium comprising the molecule, can be set by a voltage difference no greater than about 2 volts.

Information is stored in the winged trimer storage molecule by removing electrons from the porphyrin constituents (leaving a hole and forming a π-cation radical (Strachan et al. (1997) J. Am. Chem. Soc., 119: 11191–11201; Li et al. (1997) J. Mater. Chem. 7: 1245–1262, and Seth et al. (1996) J. Am. Chem. Soc. 118: 11194–11207; Seth et al. (1994) J. Am. Chem. Soc. 116: 10578–10592). The redox characteristics of subunit $P^2$ are different from $P^1$ and $P^3$. Each unit has two oxidation states with the oxidation potentials being interleaved to provide a coulomb staircase or ladder. Thus oxidation proceeds with $P^2$, then $P^1P^3$, then $P^2$ again, and then $P^1P^3$ again (It will be understood that, for each oxidation of $P^1P^3$ two electrons are removed, but it is the oxidation state rather than the number of electrons removed that provides the information stored.). The process is illustrated below in Table 1.

TABLE 1

Bit architecture in a prototype winged trimer storage molecule.

| Memory | Subunit P2 | Subunits P1 & P3 |
|---|---|---|
| "parity" | 0 | 0 |
| 00 | + | 0 |
| 01 | + | + |
| 10 | ++ | + |
| 11 | ++ | ++ |

It will be appreciated that the converse of the process set forth in Table 1 is also possible (i.e., oxidize $P^1$ and $P^3$ first, etc.).

The synthetic methodologies already established permit the extension of the linear architecture, thus increasing the dynamic range of the basic memory element well beyond the two bits indicated. In addition, subunits can be engineered that have more than two oxidation states. Thus for example, molecules and/or subunits can be engineered that have virtually any number (e.g., 2, 4, 8, 16, 32, 64, 128, etc.) of different and distinguishable oxidation states.

As indicated above, the storage medium is juxtaposed in the proximity of the electrode of an apparatus of the invention such that electrons can pass from said storage medium to said electrode. The storage medium may be juxtaposed to a dielectric material embedded with counterions. Typically, the storage medium and the electrode are fully encapsulated in an integrated circuit. In one embodiment, the storage medium is electronically coupled to a second electrode that is a reference electrode. The storage medium may be present on a single plane of a device, and may be present at a multiplicity of storage locations in the device. In another embodiment, the storage locations are present on multiple planes of the apparatus. Each storage location may be addressed by a single electrode, two electrodes, or more. In an assembled device the electrodes may be connected to a voltage source such as the output of an integrated circuit, and/or the electrode may be connected to a device to read the oxidation state of said storage medium (e.g., a voltammetric device, an amperometric device, a potentiometric device). Such a device may be a sinusoidal voltammeter. The device may provide a Fourier transform of the output signal from said electrode. The apparatus may be assembled or programmed to refresh the oxidation state of said storage medium after reading said oxidation state.

V. Synthesis and Characterization of Storage Medium Molecule(s)

A. Designing oxidation states into the storage medium molecule(s).

Control over the hole-storage and hole-hopping properties of the redox-active units of the storage molecules used in the memory devices of this invention allows fine control over the architecture of the memory device.

Such control is exercised through synthetic design. The hole-storage properties depend on the oxidation potential of the redox-active units or subunits that are themselves or that are used to assemble the storage media used in the devices of this invention. The hole-storage properties and redox potential can be tuned with precision by choice of base molecule(s), associated metals and peripheral substituents (Yang et al. (1999) *J. Porphyrins Phthalocyanines,* 3:117–147).

For example, in the case of porphyrins, Mg porphyrins are more easily oxidized than Zn porphyrins, and electron withdrawing or electron releasing aryl groups can modulate the oxidation properties in predictable ways.

The electrochemical properties of a library of monomeric Mg or Zn porphyrins bearing diverse aryl groups have been characterized (Yang et al. (1999) *J. Porphyrins Phthalocyanines,* 3:117–147). The effects of metals on metalloporphyrin oxidation potentials are well known (Fuhrhop and Mauzerall (1969) *J. Am. Chem. Soc.,* 91: 4174–4181). Together, these provide a strong foundation for designing devices with predictable hole-storage properties.

The design of compounds with predicted redox potentials is well known to those of ordinary skill in the art. In general, the oxidation potentials of redox-active units or subunits are well known to those of skill in the art and can be looked up (see, e.g., *Handbook of Electrochemistry of the Elements*). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

B. Synthesis of Storage Medium Molecules

The basic synthetic methodologies used to construct the storage medium molecules of this invention are described in Prathapan et al. (1993) J. Am. Chem. Soc., 115: 7519–7520, Wagner et al. (1995) *J. Org. Chem.,* 60: 5266–5273, Nishino et al. (1996) *J. Org. Chem.,* 61: 7534–7544, Wagner et al. (1996) *J. Am. Chem. Soc.,* 118: 11166–11180, Strachan et al. (1997) *J. Am. Chem. Soc.,* 119: 11191–11201, and Li et al. (1997) *J. Mater. Chem.,* 7: 1245–1262. These papers describe various strategies for the synthesis of a number of multiporphyrin (porphyrinic macrocycle) compounds. More particularly, these papers which focus on light capture, energy fimneling, and optical gating, have led to the preparation of nanostructures containing up to 21 covalently linked porphyrins (Fenyo et al. (1997) *J. Porphyrins Phthalocyanines,* 1: 93–99, Mongin et al. (1998) *J. Org. Chem.,* 63: 5568–5580, Burrell and Officer (1998) *Synlett* 1297–1307, Mak et al. (1998) *Angew. Chem. Int. Ed.* 37: 3020–3023, Nakano et al. (1998) *Angew. Chem. Int. Ed.* 37: 3023–3027, Mak et al. (1999) *Chem. Commun.,* 1085–1086). Two-dimensional architectures, such as molecular squares (Wagner et al. (1998) *J. Org. Chem.,* 63: 5042–5049), T-shapes (Johnson, T. E. (1995), Ph.D. Thesis, Carnegie Mellon University), and starbursts (Li et al. (1997) *J. Mater. Chem.,* 7: 1245–1262) all comprised of different covalently linked porphyrin constituents, have also been prepared.

In addition, the hole storage and dynamic hole mobility characteristics of the multiporphyrin nanostructures have been investigated in detail during the course of our other studies of these materials (Seth et al. (1994) *J. Am. Chem. Soc.,* 116: 10578–10592, Seth et al. (1996) *J. Am. Chem. Soc.,* 118: 11194–11207, Strachan et al. (1997) *J. Am. Chem. Soc.,* 119: 11191–11201; Li et al. (1997) *J. Mater. Chem.,* 7: 1245–1262, Strachan et al. (1998) *Inorg. Chem.,* 37: 1191–1201, Yang et al. (1999) *J. Am. Chem. Soc.,* 121: 4008–4018).

The general synthetic strategy involves the following approaches: (1) A modular building block synthesis of covalent multiporphyrin nanostructures; and (2) The directed self-assembly of the resulting nanostructures on electrode (e.g. gold electrode) surfaces.

The methods for synthesis, purification, and characterization for the molecular memory molecules generally follow those employed in the modular stepwise synthesis (Lindsey et al. (1994) *Tetrahedron,* 50: 8941–8968) of molecular wires (Wagner et al. (1994) *J. Am. Chem. Soc.,* 116: 9759–9760), optoelectronic gates (Wagner et al. (1996) *J. Am. Chem. Soc.,* 118: 3996–3997) and light-harvesting nanostructures (Prathapan et al. (1993) *J. Am. Chem. Soc.,* 115: 7519–7520, Johnson, T. B. (1995), Ph.D. Thesis, Carnegie Mellon University, Wagner et al. (1996) *J. Am. Chem. Soc.,* 118: 11166–11180, Li etal. (1997) *J. Mater. Chem.,* 7: 1245–1262, and Li et al. (1998) *J. Am. Chem. Soc.,* 120: 10001–10017). In preferred embodiments, the following synthetic methods form the foundation for the building block synthesis of multiporphyrin nanostructures:

(1) A room temperature one-flask synthesis of meso-substituted porphyrins (Lindsey et al. (1987) *J. Org. Chem.* 52: 827–836, Lindsey et al. (1994) *J. Org. Chem.* 59: 579–587, Li et al. (1997) *Tetrahedron,* 53: 12339–12360).

(2) Incorporation of bulky groups around the porphyrin to achieve enhanced solubility in organic solvents (Lindsey and Wagner (1989) *J. Org. Chem.* 54: 828–836).

(3) A one-flask synthesis of dipyrromethanes, key building blocks in the synthesis of porphyrins bearing 2–4 different meso-substituents (Lee and Lindsey (1994) *Tetrahedron* 50: 11427–11440, Littler et al. (1999) *J. Org. Chem.* 64:1391–1396).

(4) A synthesis of trans-substituted porphyrins without acidolytic scrambling (Littler et al. (1999) *J. Org. Chem.,* 64: 2864–2872).

(5) A 9-step synthesis of porphyrins bearing 4 different meso-substituents (Lee et al. (1995) *Tetrahedron* 51: 11645–11672).

(6) Mild methods for inserting magnesium (Lindsey and Woodford (1995) *Inorg. Chem.* 34: 1063–1069, O'Shea et al. (1996) *Inorg. Chem.* 35: 7325–7338) or other metals (Buchler, J. W. In *The Porphyrins; Dolphin, D. Ed.; Academic Press: New York.* 1978; Vol. I, pp. 389–483) into porphyrins.

(7) Efficient Pd-mediated coupling reactions (60–80% yields in 1–2 h at 35° C.) for constructing diphenylethyne linkers joining the porphyrins (Wagner et al. (1995) *J. Org Chem.*, 60: 5266–5273; Wagner et al. (1999) *Chem. Mater.* 11: 2974–2983).

In one embodiment, building blocks are synthesized using methods described by Wagner et al. (1996) *J. Am. Chem. Soc.*, 118: 11166–11180, Strachan et al. (1997) *J. Am. Chem. Soc.*, 119: 11191–11201, Wagner et al. (1996) *J. Am. Chem. Soc.*, 118: 3996–3997, Li et al. (1997) *J. Mater. Chem.*, 7: 1245–1262; Lindsey et al. (1994) *Tetrahedron*, 50: 8941–8968; Wagner et al. (1994) *J. Am. Chem. Soc.*, 116: 9759–9760; Lindsey and Wagner (1989) *J. Org. Chem.*, 54: 828–836; Lee and Lindsey (1994) *Tetrahedron*, 50: 11427–11440; Lee et al. (1995) *Tetrahedron*, 51: 11645–11672; Lindsey and Woodford (1995) *Inorg. Chem.* 34: 1063–1069; and Wagner et al. (1995) *J. Org. Chem.*, 60: 5266–5273.

The synthesis of the molecules that form the basis for the storage molecules is performed using a modular building block approach. This approach employs a stepwise synthesis (rather than polymerization) and yields highly purified and well-characterized products. One approach utilizes a series of redox-active "building blocks" (e.g., a series of monomeric porphyrinic macrocycles or ferrocene constituents) that can be linked to the gold substrate that will serve as one of the electrodes in the chip. Preferred monomeric redox-active units that are prepared have different oxidation potentials that fall in the range from 0 to 1.3 volts.

Using the synthesis strategies exemplified here and in the examples, one of ordinary skill in the art can routinely produce relatively complex data storage molecules for use in the devices of this invention.

C. Characterization of the Storage Media

The storage media molecule(s), once prepared, can be characterized according to standard methods well known to those of skill in the art. The characterization of multiporphyrin nanostructures has been described (see, e.g., Strachan et al. (1997) *J. Am. Chem. Soc.*, 119: 11191–11201; Wagner etal. (1996) *J. Am. Chem. Soc.*, 118: 3996–3997; Li et al. (1997) *J. Mater. Chem.*, 7: 1245–1262; Seth et al. (1996) *J. Am. Chem. Soc.*, 118:11194–11207; Seth et al. (1994) *J. Am. Chem. Soc.*, 116: 10578–10592). In a preferred embodiment, the electrochemical studies include cyclic and square-wave voltammetry to establish the redox potentials of the monomeric and multi-unit constituents of the storage media. Bulk electrochemical oxidations are performed on each of the storage materials to assess the hole-storage capabilities and the stability. Absorption and vibrational spectroscopic methods are used to assess the structural and electronic properties of both the neutral and oxidized materials. Electron paramagnetic resonance techniques are used to probe the hole-storage and hole-mobility characteristics of the oxidized storage molecules. Using the above-identified techniques, benchmarks for the expected performance characteristics of a storage molecule (e.g., oxidation potentials, redox reversibility, dynamic hole-mobility characteristics, etc.) can be ascertained.

D. Self-assembly of the Storage Medium Molecules on Target Substrates

In preferred embodiments, the storage molecules comprising the storage medium are designed to self-assemble on a substrate (e.g. a metal such as gold). The disklike structure of the porphyrin macrocycles engenders self-assembly. Self-assembled monolayers of porphyrins on solid substrates are well known and have been extensively studied (see, e.g., Schick et al. (1989) *J. Am. Chem. Soc.*, 111:1344–1350, Mohwald et al. (1986) *Thin Solid Films*, 141: 261–275).

To exert control over the pattern of self-assembly, reactive sites (e.g. thiols) or linkers bearing active sites are incorporated into the storage molecules (nanostructures). The reactive sites bind to the target (e.g. gold electrode) surface giving an organized self assembled structure. In the case of porphyrins with thiol-derivatized linkers attached to the meso positions, the porphyrins arrange in horizontal orientations. Non-covalent interactions between storage molecules are typically weak, particularly when bulky aryl groups are attached to each of the porphyrins.

VI. Writing to the Storage Device

In preferred embodiments of the data storage devices of this invention, information is written to a particular memory location via application of a potential of the requisite value and temporal duration at the appropriate working and reference electrode(s) to achieve the desired digital value. The information can be erased via application of a potential of the opposite sign.

The writing process is illustrated with respect to storage of data in a storage molecule. One particular such molecular memory is illustrated by Formula I and the writing process is summarized below in Table 2.

Figure 5:
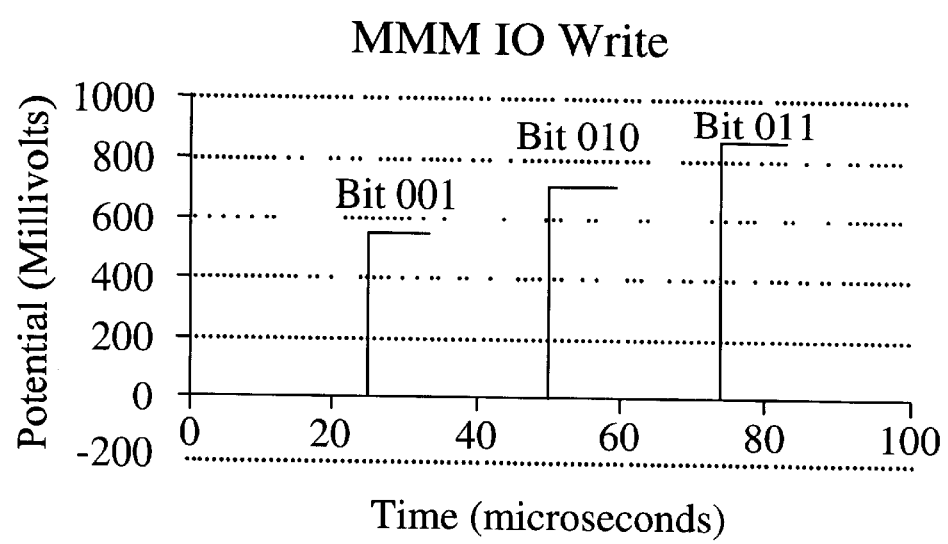
FIG. 5 illustrates writing to a molecular memory of this invention. In preferred embodiments, this is accomplished through the application of very short (e.g., microsecond) pulses applied at a voltage sufficient to oxidize a storage medium (e.g., a porphyrin) to the appropriate redox state as summarized in this figure. Thus, each redox state of the composite multiunit nanostructure (e.g., a porphyrinic array) can be accessed. This can be accomplished via the electrochemical oxidation of the molecule in stepwise increments.

As shown in Table 2, each porphyrin has two redox processes, each of which is separated by at least 150 mV. To activate bit 01, a potential greater than 0.38 V (but less than 0.51 V) would be applied to the memory element to oxidize the magnesium porphyrin to its first oxidation state. The other porphyrins in the SHMU storage molecule could then be sequentially oxidized through the various redox states to provide the different bits. In preferred embodiments, this is accomplished through the application of very short (e.g., microsecond) pulses applied at a voltage sufficient to oxidize a porphyrin to the appropriate redox state. This process is summarized in FIG. 5. Thus, each redox state of the composite porphyrinic nanostructure can be independently accessed. This can be accomplished via the electrochemical oxidation of the molecule in stepwise increments.

TABLE 2

| Redox properties of model metalloporphyrins (MP)[1]. | | |
|---|---|---|
| Bit | Redox process | $E^0$ (V vs. Ag/AgCl) |
| 00 | All redox components in neutral state | |
| 01 | MgPZnP <--> MgP$^+$ ZnP + 1e$^-$ | 0.38 |
| 10 | MgP$^+$ZnP <--> MgP$^+$ ZnP$^+$ + 1e$^-$ | 0.51 |
| 11 | MgP$^+$ZnP$^+$ <--> MgP$^{2+}$ ZnP$^+$ + 1e$^-$ | 0.71 |

[1]Either Mg or Zn can be in the P$^1$P$^3$ position.

There is a great advantage to the small size of each memory element, which is essentially a modified electrode surface. When each memory element is reduced to sub-micron dimensions, the area of the surface allows the presence of only a few hundred data storage (e.g., porphyrin) molecules. Using Faraday's law, Q=nFN (where Q equals the total charge, n equals the number of electrons per molecule, F is 96,485 Coulombs/mole and N is the number of moles of electroactive species present), it can be determined that only a small charge ($1.6 \times 10^{-16}$C; if passed in 1 μs, would result in a current of roughly 160 pA) must pass in order to change the electrochemical charge corresponding to each bit.

Additionally, the intrinsic limitation to the speed of most electrochemical experiments lies in the time required to charge the electrode to the appropriate potential (the charging current, which has a time dependence of $\exp(-t/RC)$). Since the capacitance of the electrode is directly proportional to its area, miniaturization of each element of the system to submicron dimensions will greatly increase its speed. For example, a square gold electrode with 0.1 $\mu$m dimensions would have a capacitance of approximately $2\times10^{-19}$F, leading to an RC time constant of only 2 picoseconds. For this reason, electrode charging currents should be insignificant in determining the ultimate performance of these devices.

The voltage used to write the data can be derived from any of a wide variety of sources. In a simple embodiment, the voltage can simply be the output from a power supply. However, in preferred embodiments, the voltage will be the output from some element of an electronic circuit. The voltage can be a signal, the representation of a logic state, the output from a gate, from an optical transducer, from a central processing unit, and the like. In short, virtually any voltage source that can be electrically coupled to the devices of this invention can be used to write data to the storage media therein.

VII. Reading from the Storage Device

The storage device(s) of this invention can be read according to any of a wide variety of methods well known to those of ordinary skill in the art. Essentially any method of detecting the oxidation state of a compound can be utilized in the methods of this invention. However, where the readout is destructive of the state of the memory cell(s) (e.g. in certain memories), the read will preferably be followed by a refresh to reset the oxidation state of the storage cell.

In particularly preferred embodiments, the storage medium 102 of a storage cell 100 is set to neutral (e.g., 0 potential for the system, but which might not be at true zero voltage with respect to ground) using the working electrode. The oxidation state of the memory cell is then set by changing the potential at the reference electrode 103 (e.g. by setting the reference electrode negative to the desired voltage). The oxidation state of the storage cell is then measured (e.g. using sinusoidal voltammetry) via the working electrode 101. In this preferred format, the oxidation state is assayed by measuring current. By measuring current at the working electrode 101 and setting the state with the reference electrode 103, the measurement is not made at the place the potential is applied. This makes it far simpler to discriminate the oxidation state. If the potential were applied to the electrode through which the current was measured unnecessary noise would be introduced into the system.

A. Reading from the Storage Media.

In the case of the storage media as described herein, the reading of information from a particular memory location is achieved extremely rapidly by sweeping a potential over the full range used to establish the dynamic range of the storage element. The fidelity of the measurement is dependent on how well the oxidation state of the individual storage element can be determined. Traditionally, electrochemical methods could only improve the signal to noise ratio by discriminating the faradaic signal from the background components in the time domain through application of pulse waveforms (ie., differential pulse polarography, square wave voltammetry). These methods discriminate the faradaic current from the charging current in the time domain, since charging currents decay much more rapidly than the faradaic current ($\exp(-t/RC)$ vs $t^{-\frac{1}{2}}$, respectively). However, the analytical faradaic current is not totally discriminated from the charging current, and most of the signal is discarded because sampling is done late in the pulse cycle.

More recently, sinusoidal voltammetry (SV) has been shown to have significant advantages over traditional waveforms in an electrochemical experiment (Singhal and Kuhr (1997) AnaL Chem., 69: 1662–1668. For example, the background current resulting from cyclic voltammetry (consisting primarily of charging current) resembles a square wave, which contains significant intensity at both fundamental and odd harmonic frequencies. In contrast, the charging current resulting from sine wave excitation has only one frequency component centered at the fundamental, while the faradaic current is distributed over many frequencies. This characteristic of sine wave excitation simplifies the electroanalytical measurement, since the signal from each oxidation state can be fine-tuned by "locking-in" on one of the higher frequency harmonics. Ultimately, the speed at which this can be performed is only limited by the kinetics of the redox reaction, which may ultimately lead to megahertz frequency operation.

Since most electrochemical methods rely on differences between the $E_{1/2}$'s ($E_{1/2}$ is the potential at which half of the subject molecules are oxidized or reduced to a particular oxidation state) to differentiate compounds present in a sample and thereby to generate the selectivity for the measurement, this has severely limited the utility of electrochemical methods for the analysis of many complex matrices. In contrast, sinusoidal voltammetry can exploit the vast diversity in electron transfer rates observable at solid electrodes ($k^0$, the rate of electron transfer) can vary over ten orders of magnitude at the same electrode surface) to obtain additional selectivity in the electrochemical measurement.

The composition of the frequency spectrum is extremely dependent on the rate of electron transfer. By adjusting the frequency of the sinusoidal (or other time-varying) excitation waveform, it becomes possible to use this kinetic information as well as the phase information to discriminate between two molecules which have very similar electrochemical properties. For example, this technique has been used for the detection of the direct oxidation of double-stranded DNA at copper electrodes (Singhal and Kuhr (1997) Anal. Chem., 69: 1662–1668). Where this is usually undetectable at conventional electrodes with standard voltammetric techniques, the use of sinusoidal voltammetry allowed the measurement of 1.0 nM double-stranded DNA. The concentration detection limit (S/N=3) for this size of dsDNA at the 6th harmonic is 3.2 pM. When coupled with a low-volume system, such as a monolayer of the adsorbed material, this allows detection of sub-zeptomole ($10^{-21}$ mole) quantities of the storage medium molecule(s) on the surface.

This procedure may ultimately degrade the memory in the absence of a refresh mechanism. The level of degradation will depend on the total number of molecules ultimately used to ensure acceptable fault tolerance. To avoid degradation problems, however, a refresh cycle (a write cycle resetting the memory to the read value) can be inserted immediately after each read cycle is complete.

B. Instrumentation for Reading/writing Molecular Memories

As indicated above, the molecular memory devices can be read by any of a wide variety of electrochemical technologies including amperometric methods (e.g. chronoamperometry), coulometric methods (e.g. chronocoulometry), voltammetric methods (e.g., linear sweep voltammetry, cyclic voltammetry, pulse voltammetries, sinusoidal voltammetry, etc.), any of a variety of capacitance measurements, and the like. Such readouts can be performed in the time and/or frequency domain.

In one preferred embodiment, readout is accomplished using a fast potentiostat/voltammetry system. Such a system is capable of reading and writing the memory elements on a microsecond time scale. Such a system can be modified from a prototypical system described in U.S. Pat. No. 5,650,061.

Figure 6:
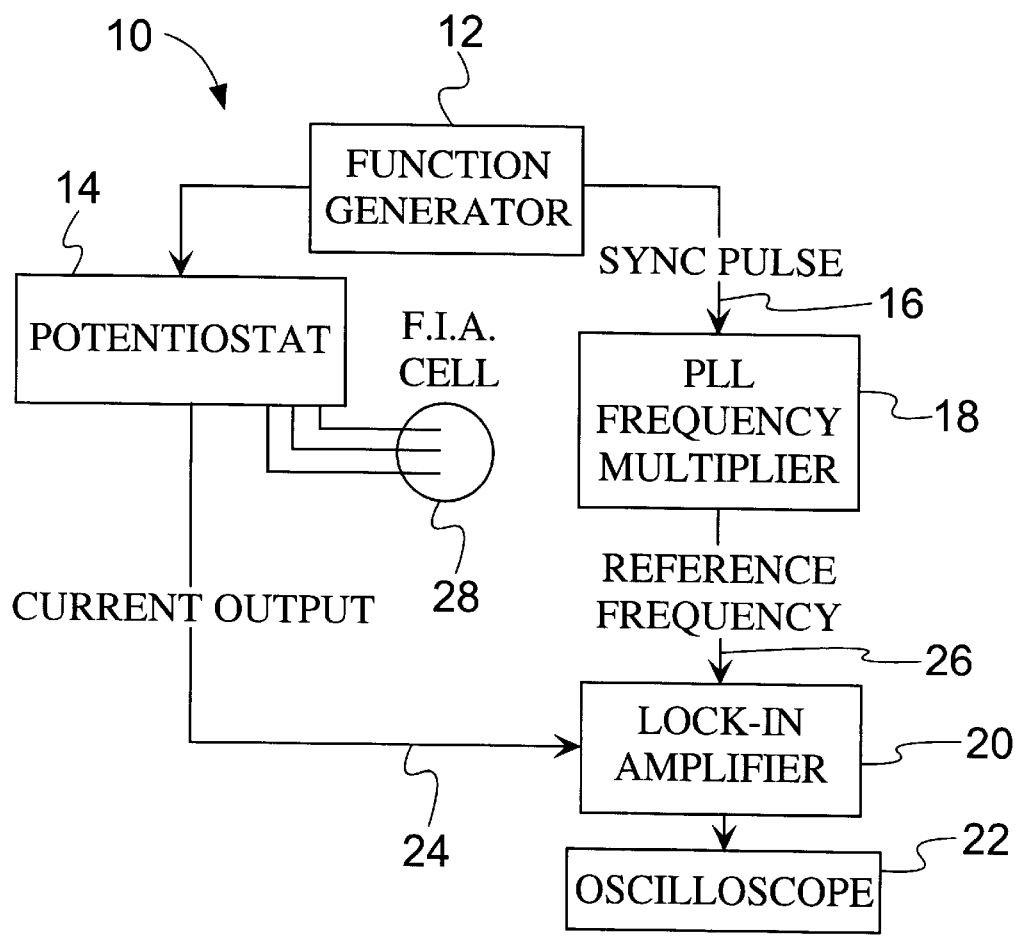
FIG. 6 illustrates a sinusoidal voltammetry system suitable for readout of the memory devices of this invention.

As illustrated in FIG. 6, a potentiostat with an RC time constant less than one microsecond is provided by using a fast voltage driver (e.g., video buffer amplifier). A preferred video buffer amplifier retains a usable bandwidth beyond 20 MHz and is used to rephase the voltage and current in the excitation signal to zero phase shift between voltage and current. This rephasing of the excitation signal immediately before the working electrode cancels out any phase shift which might be introduced by capacitance in the cable leading from the Arbitrary Waveform Synthesizer (AWS) function generator. An important part of the current monitor is a wide band op-amp. By using an op-amp with a very wide gain-bandwidth product, the amplifier gain can be set to 10,000 and still retain a bandwidth usable from DC to above 1 MHz. This allows the collection of impedance data from electrodes as small as a 1 $\mu$m disk over a frequency range from 15 kHz to 5 MHz.

VIII. Use of the Storage Device in Computer Systems

Figure 7:
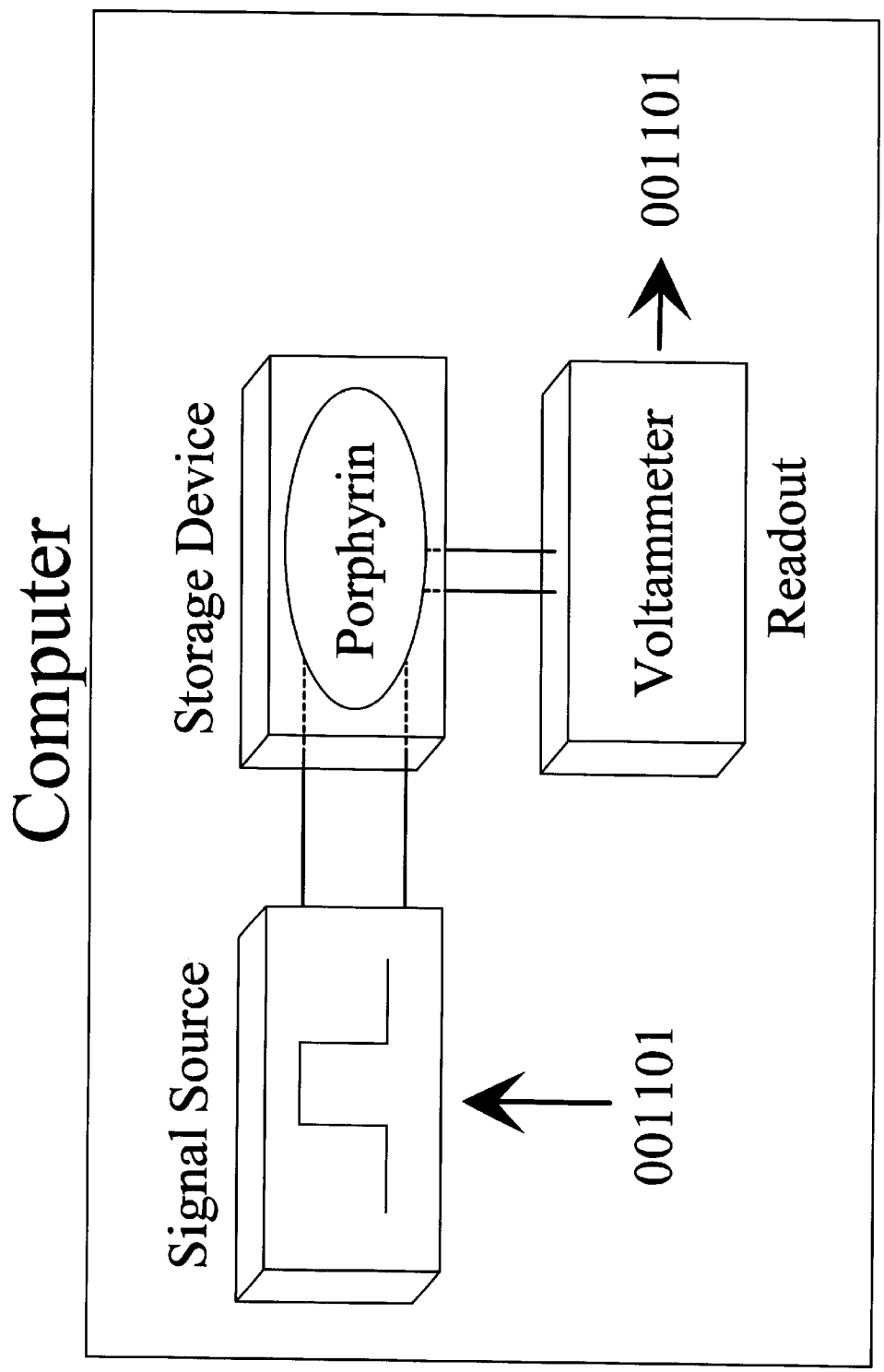
FIG. 7 illustrates a computer system embodying the memory devices described herein. Typically the memory device will be fabricated as a sealed "chip". Ancillary circuitry on the chip and/or in the computer permits writing bits into the memory and retrieving the written information as desired.

The use of the storage devices of this invention in computer systems is contemplated. One such computer system is illustrated in FIG. 7. The computer comprises a signal source (e.g. 110 device or CPU), a storage device of this invention, and appropriate circuitry (e.g. voltammetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the 110 circuitry and the information is passed off to other elements (e.g. CPU) in the computer.

Figure 8:
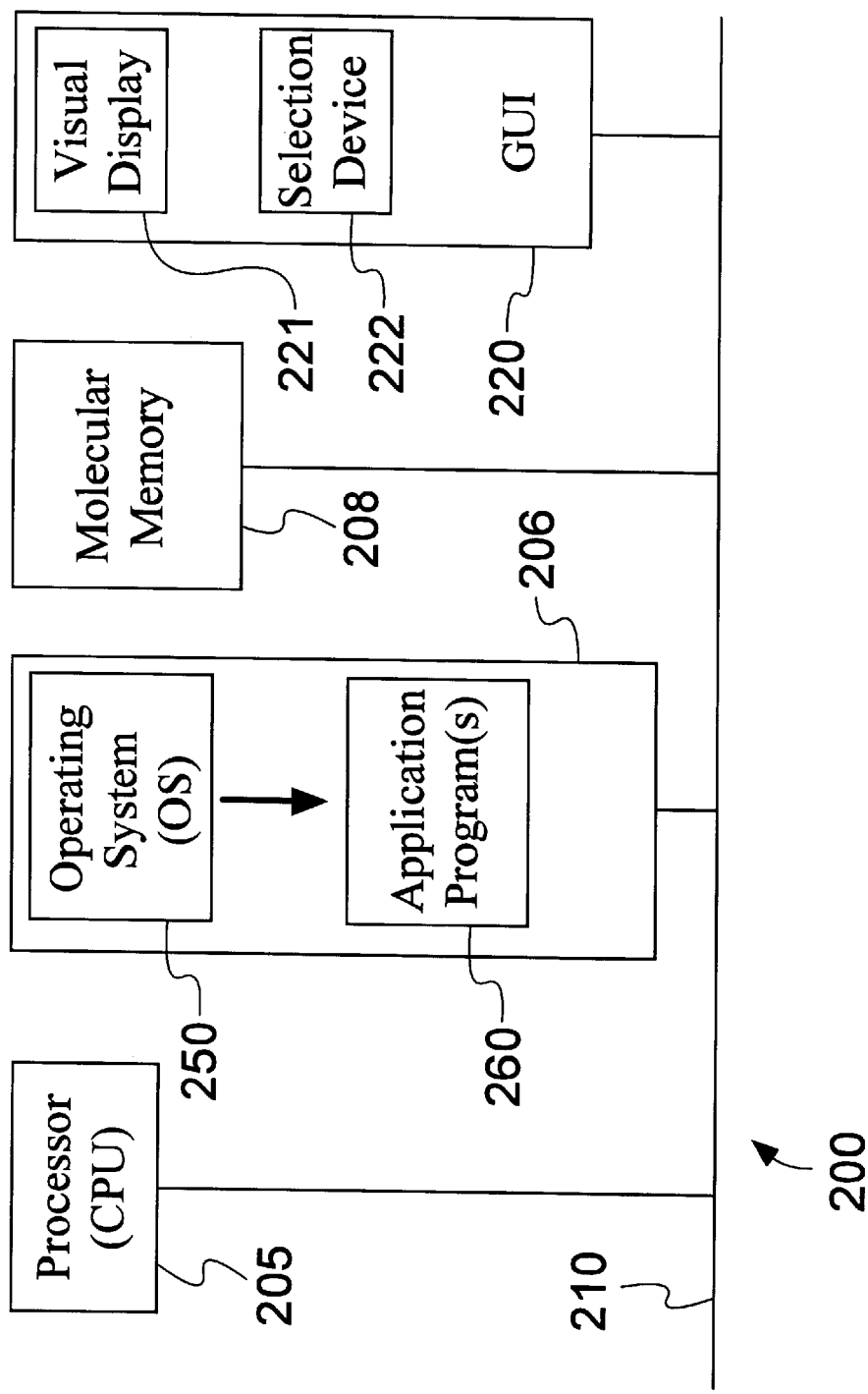
FIG. 8 illustrates the memory devices of this invention integrated into a standard computer architecture or computer system 200.

FIG. 7 and FIG. 8 illustrate the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the elements shown in FIG. 6. System 200 can further include additional hardware components (not shown).

System 200 can be, for example, a personal computer or workstation. Processor 205 can be, for example, a microprocessor, such as the 80386, 80486 or Pentium™ microprocessor, made by Intel Corp. (Santa Clara, Calif.). Memory 206 can include, for example, random-access memory (RAM), read-only memory (ROM), virtual memory, molecular memory or any other working storage medium or media accessible by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 250 can be, for example, the Microsoft® Windows™ 95 operating system for IBM PC and compatible computers having or emulating Intel 80386, 80486, or Pentium™ processors. Alternatively, the operating system can be specialized for operation utilizing molecular memory elements. Application program 260 is any application compatible with the operating system and system 200 architecture. Persons of skill in the art will appreciate that a wide range of hardware and software configurations can support the system and method of the present invention in various specific embodiments.

The present invention is explained in greater detail in the following non-limiting Examples.

EXAMPLE 1

Synthesis of Thiol-Derivatized Porphyrin Trimers for Attachment to Electroactive Surfaces The storage of a larger number of bits per molecule requires the ability to access a larger number of oxidation states. We have previously developed a modular synthesis of multiporphyrin arrays that function as molecular wires (Wagner et al. (1999) *J. Am. Chem. Soc.* 116: 9759–9760), optoelectronic gates (Wagner et al. (1996) *J. Am. Chem. Soc.* 118: 3996–3997), light-harvesting arrays (Li et al. (1999) *J. Am. Chem. Soc.* 121: 8927–8940), and integrated antenna-reaction center complexes (Kuciauskas et al. (1999) *J. Am. Chem. Soc.* 121: 8604–8614). These multiporphyrin arrays did not include provisions for attachment to electroactive surfaces and were examined in solution. We decided to build on this fundamental synthetic methodology and construct porphyrin trimers that could be attached to an electroactive surface for studies of information storage. A key feature of this design is that the redox-active units must have non-identical oxidation potentials. We decided to synthesize porphyrin trimers where the central porphyrin would rest horizontally on the gold surface via thiol linkers and the two end porphyrins would not have thiols but would be attached to the central porphyrin. As the central or "base" porphyrin we chose a trans-oriented S-protected m-(thiomethyl)phenyl porphyrin for attachment to the gold surface. The remaining two meso-positions could then be used for the linkage of the two end porphyrin units. The structure of these trimers, comprised of a central porphyrin with two sites of attachment to a surface and bilateral porphyrins projecting from the meta-phenyl positions suggested a type of "winged two-legged spider", a descriptive name we have adopted for this set of molecules.

Two fundamental questions can be addressed through investigation of these molecules. (1) Can the porphyrins in the wings of the trimers be addressed electrochemically by communication through the base porphyrin and intervening linker? (2) Are there any substantive differences in a design with the low-potential porphyrin at the base and the high potential porphyrins in the wings, or vice versa? Gaining information about these issues is essential for the rational design of more elaborate molecular architectures for information storage. For ease of synthesis and electrochemical investigation, we decided to synthesize symmetrical "winged spiders" with identical porphyrins in the wings.

The ability to tune the electrochemical potentials of the base porphyrin and the porphyrins in the wings is essential for achieving distinct oxidation states. The base porphyrin in the trimer has four meso-substituents, two for attachment of the porphyrin wings, and two bearing thiol units. While the oxidation potential of the base porphyrin can only be changed easily by the use of different metals, the potentials of the porphyrins in the wings can be changed either by variation of the metals or by incorporation of different substituents in the meso-positions. We synthesized five different "two-legged winged-spiders" using these approaches for investigation of the properties of this class of multiporphyrin arrays.

Results and Discussion.

Synthesis of Porphyrin Monomers

Figure 9:
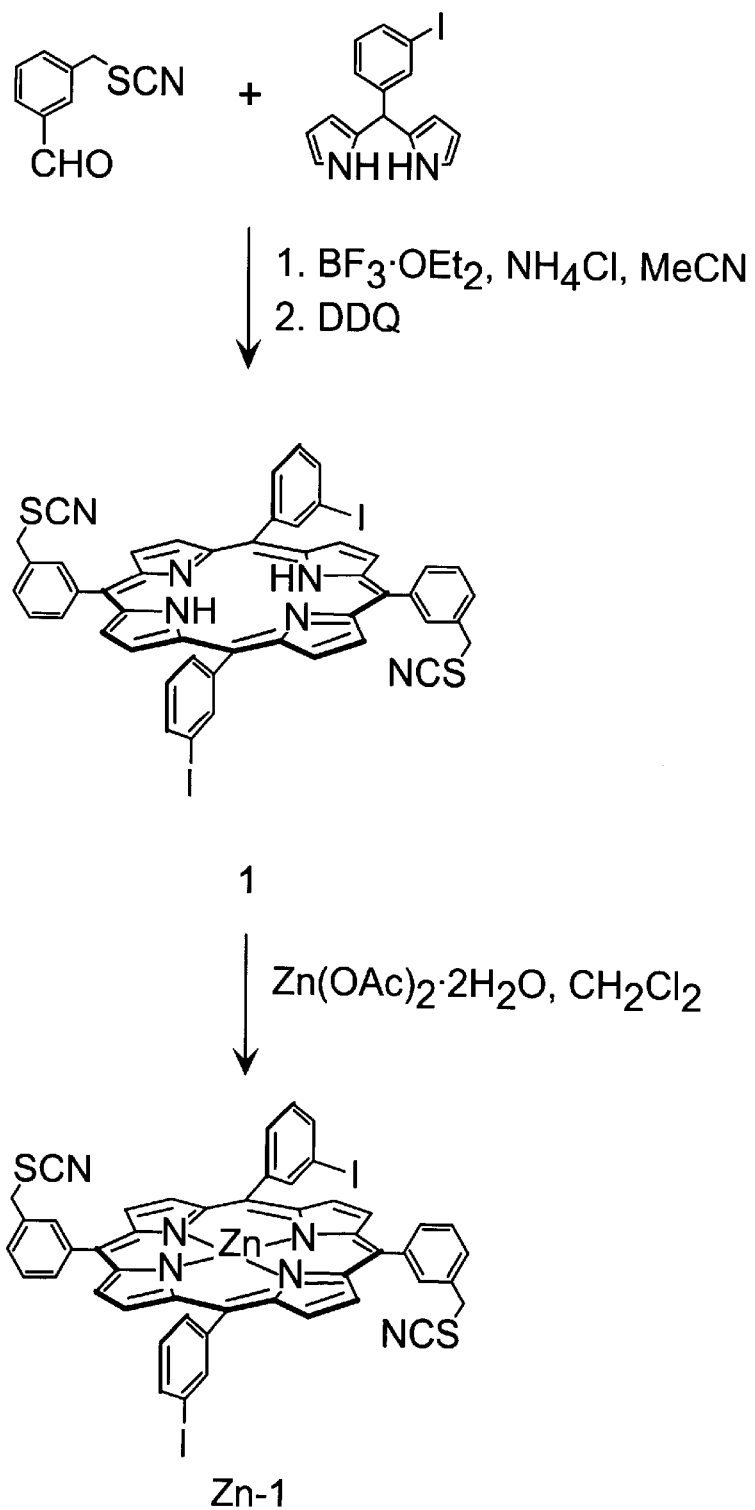
FIG. 9 illustrates a first approach towards thiol protected porphyrins that could be used in the Pd-coupling reaction for preparing "winged trimers." This approach begins with the synthesis of zinc(II)-5,15-bis(3-iodophenyl)-10,20-bis[3-(thiocyanatomethyl)phenyl]porphyrin (Zn-1).

Our strategy for synthesizing trimers which could be attached to gold surfaces was to use a base porphyrin unit bearing two protected 3-mercaptomethylphenyl groups at the 10,20 meso-positions and two 3-iodophenyl groups at the 5,15 meso-positions. The coupling of this thiol protected trans-porphyrin with two equivalents of a porphyrin bearing an ethynylphenyl group would give the desired trimer. Our first approach towards thiol protected porphyrins that could be used in the Pd-coupling reaction was to synthesize zinc(II)-5,15-bis(3-iodophenyl)-10,20-bis[3-(thiocyanatomethyl)phenyl]porphyrin (Zn-1) (FIG. 9). The thiocyanato group was chosen as the thiol-protecting group due to its high chemical stability. Porphyrin 1 was obtained in 6% yield by condensation of m-(thiocyanatomethyl) benzaldehyde and 5-(3-iodophenyl)dipyrromethane using a method for preparing trans-porphyrins under minimal scrambling conditions (Littler et al. (1999) *J. Org. Chem.* 64: 2864–2872). Metalation of porphyrin 1 with $Zn(OAc)_2$.$2H_2O$ afforded Zn-1 quantitatively. A Pd-coupling reaction of Zn-1 with zinc(II)-5-(p-ethynylphenyl)-10,15,20-trimesitylporphyrin (Wagner et al. (1995) *J. Org. Chem.* 60: 5266–5273) under standard conditions (30 mol % $Pd_2(dba)_3$ P-(o-tol)$_3$/THF/TEA/35° C.) failed. This failure can be attributed to the complexation of the Pd by the thiocyanates, forming an insoluble complex. Such complexes have been observed before under different conditions (Davis et al. (1990) *J. Chem. Soc. Perkin Trans.*, 2881–2887).

Figure 10:
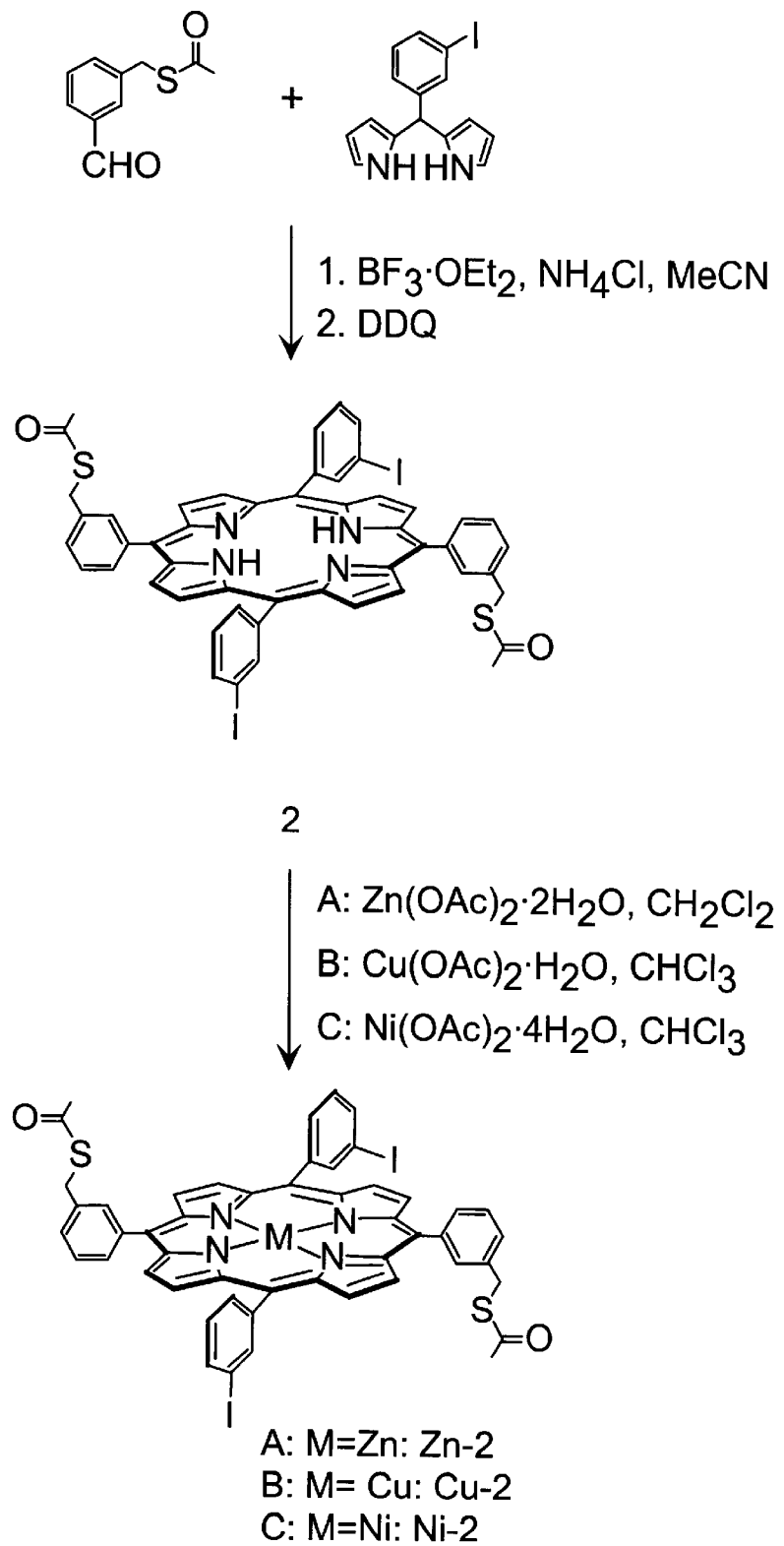
FIG. 10 illustrates a similar synthetic approach to FIG. 9, except the thioacetate group was used as a protecting group rather than the thiocyanate unit.

To overcome this problem we employed the thioacetate protecting group rather than the thiocyanate unit. Using similar conditions as for the synthesis of Zn-1 we obtained Zn-2 as a purple solid (FIG. 10). The coupling reaction of Zn-2 and the ethynyl porphyrin proceeded as expected and the trimer ZnZnZn-5 was obtained in 40% yield (vide infra).

Figure 11:
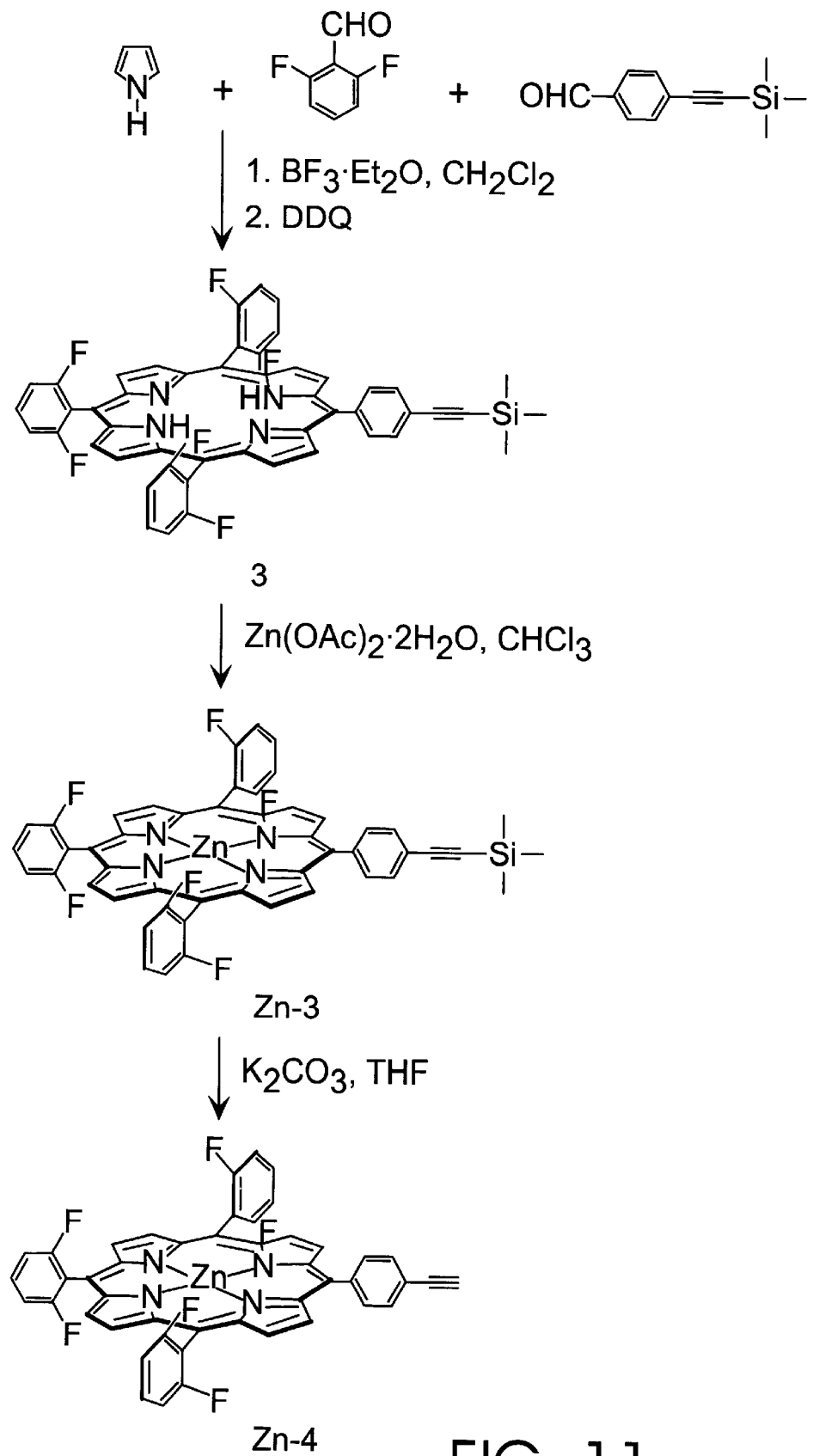
FIG. 11 illustrates a mixed condensation of pyrrole, 2,6-difluorobenzaldehyde and 4-[2-(trimethylsilyl)ethynyl] benzaldehyde in $CH_2Cl_2$ to give porphyrin 3 together with other porphyrins.

The oxidation potentials of the porphyrins on the wings were tuned through use of different meso-substituents. To increase the oxidation potential compared with trimesityl-substituted porphyrins, we turned to porphyrins bearing 2,6-difluorophenyl groups (Yang et al. (1999) *J. Porphyrins Phthalocyanines* 3: 117–147). A mixed condensation of pyrrole, 2,6-difluorobenzaldehyde and 4-[2-(trimethylsilyl) ethynyl]benzaldehyde (Ravikanth et al. (1998) *Tetrahedron* 54: 7721–7734) in $CH_2Cl_2$ gave porphyrin 3 together with other porphyrins (FIG. 11). Metalation of 3 with $Zn(OAc)_2$.$2H_2O$ afforded Zn-3 which was deprotected with $K_2CO_3$ in THF at room temperature to yield the free ethynyl porphyrin Zn-4.

The oxidation potential of the base porphyrin was tuned by use of different metals. Metalation of the trans-porphyrin 2 with $Cu(OAc)_2$.$H_2O$ or $Ni(OAc)_2$.$4H_2O$ in $CHCl_3$ gave the corresponding metalloporphyrin Cu-2 or Ni-2 (FIG. 10) in good yield as an orange-purple solid.

Synthesis of Porphyrin Trimers.

To synthesize the desired porphyrin trimers we used the Pd-catalyzed reaction of an aryl iodide with an aryl ethyne. To prevent metal exchange we avoided the use of copper salts as co-catalyst. The conditions for this special case of porphyrin coupling (Wagner et al. (1995) *J. Org. Chem.* 60: 5266–5273) have recently been refined and involve use of $Pd_2(dba)_3$ as catalyst (30 mol %) and tri-ortho-tolylphosphine as ligand. THF was used as the main solvent to achieve improved solubility of the diiodoporphyrins Zn-2, Cu-2 and Ni-2, which are only slightly soluble in toluene. Even in THF the solubility of Cu-2 is so low that only a suspension could be obtained. The reactions were performed at 35° C. in the dark under argon. Higher temperatures (40° C.) led to an increase in the amount of higher molecular material and lower yields of the desired trimer. It is of utmost importance to exclude oxygen, otherwise the reaction will not go to completion. The addition of more $Pd_2(dba)_3$ started the reaction again, but too much $Pd_2(dba)_3$ also resulted in an increase of higher molecular material at the expense of the trimer. The reactions were monitored by analytical SEC (HPLC) and stopped if no increase in yield was observed and the amount of monomers and dimer present was under 25%.

In this manner the trimers ZnZnZn-5, ZnCuZn-5 and Zn-Ni-Zn-5 were obtained in yields from 26 to 51% (FIG. 12). The formation of ZnCuZn-5 and ZnNiZn-5 required the addition of extra Pd-catalyst, probably due to solubility problems. In each of these trimers the oxidation potentials of the base and wing porphyrins are similar. To examine a trimer with higher potentials at the wings relative to the base porphyrin we synthesized ZnZnZn-6 in 38% yield by coupling Zn-2 with Zn-4 under the conditions stated above (FIG. 13). A trimer with a lower oxidation potential of the wing porphyrins was synthesized by coupling Cu-2 with magnesium(II) 5-(4-ethynylphenyl)-10,15,20-trimesitylporphyrin (Li et al. (1997) *J. Mater. Chem.* 7: 1245–1262) under the above conditions in 21% yield. The resulting trimer MgCuMg-5 must be handled with care under neutral or basic conditions. Traces of acid lead to demetalation of magnesium and insertion of magnesium(II) is not possible in the presence of thioacetate groups. The yield of the trimer MgCuMg-5 in the crude mixture was around 60% upon estimation by analytical SEC.

Conclusion

Porphyrins bearing thioacetate and iodo groups have been coupled with ethynyl porphyrins under Pd-mediated conditions to yield trimers. Various kinds of metals may be inserted into the porphyrin monomers. Porphyrins with thiocyanate groups interfere with the coupling reaction by forming a complex with the Pd-catalyst.

Experimental

General

All chemicals obtained commercially were used as received unless otherwise noted. Reagent grade solvents ($CH_2Cl_2$, $CHCl_3$, hexanes) and HPLC grade solvents (acetonitrile, toluene) were used as received from Fisher. Pyrrole was distilled from $CaH_2$. THF was distilled from sodium/benzophenone. All reported NMR spectra were obtained at 300 MHz. UV-Vis absorption and fluorescence spectra were recorded in toluene as described previously (Li et al. (1997) *J. Mater. Chem.* 7: 1245–1262). Flash chromatography was performed on flash silica (Baker, 200–400 mesh) or alumina (Fisher, 80–200 mesh). Mass spectra were obtained via laser desorption (LD-MS) in the absence of an added matrix (Fenyo et al. (1997) *J. Porphyrins Phthalocyanines* 1: 93–99) using a Bruker Proflex II mass spectrometer, fast atom bombardment (FAB-MS) using a JEOL HX110HF mass spectrometer (ion source 40° C., CsKI or polyethylene glycol standards, 10 ppm elemental compositional accuracy for the porphyrins), or electron-impact mass spectrometry (EI-MS). Porphyrin metalation was monitored by fluorescence excitation and emission spectroscopy.

General procedure for metal insertion

A solution of porphyrin in $CHCl_3$ or $CH_2Cl_2$ and a solution/suspension of the metal acetate in methanol were combined and stirred in the dark. After the metalation was completed (checked by fluorescence excitation spectroscopy), $H_2O$ was added. The phases were separated and the organic layer was washed three times with 5% $NaHCO_3$ and dried ($Na_2SO_4$). The solvents were removed under reduced pressure. Purification was done by column chromatography over flash silica gel.

Zinc(II)-5,15-Bis(3-iodophenyl)-10,20-bis[3-(thiocyanatomethyl)phenyl]porphyrin (Zn-1).

A solution of 1 (90.0 mg, 89.2 $\mu$mol) in $CH_2Cl_2$ (90 mL) and $Zn(OAc)_2 \cdot 2H_2O$ (200 mg, 0.9 mmol) in methanol (10 mL) were stirred for 3 h at room temperature. The title compound was obtained without chromatography in quantitative yield as a purple solid.

IR (neat): $\nu$=2922, 2154, 1583; $^1$H NMR ($CDCl_3$): $\delta$=4.45 (s, 4H), 7.45–7.53 (m, 2H), 7.77–7.85 (m, 4H), 8.10–8.27 (m, 8H), 8.58 (br, s, 2H), 8.97 (s, 8H); LD-MS obsd 1071.3 [$M^+$], 1013.4 [$M^+$–SCN], 955.3 [$M^+$–2 SCN]; FAB-MS obsd 1069.9185, calcd exact mass 1069.9198 ($C_{48}H_{28}I_2N_6S_2Zn$); $\lambda_{abs}$ (toluene) 425, 551, 590 nm; $\lambda_{em}$ (toluene) 598, 647 nm.

Zinc(II)-5,15-Bis(3-iodophenyl)-10,20-bis[3-(S-acetylthiomethyl)phenyl]porphyrin (Zn-2)

A solution of 2 (80.0 mg, 76.7 $\mu$mol) (Wagner et al. (1999) *Chem. Mater.* 11: 2974–2983; Gryko et al. (1999) *J. Org. Chem.* 64: 8635–8647) in $CH_2Cl_2$ (70 mL) and $Zn(OAc)_2 \cdot 2H_2O$ (180 mg, 0.8 mmol) in methanol (10 mL) were stirred for 4 h at room temperature. The title compound was obtained without chromatography in quantitative yield as a purple solid.

IR (neat): $\nu$=3052, 2921, 2852, 1690, 1583; $^1$H NMR (300.5 MHz, $CDCl_3$): $\delta$=2.37 (s, 6H), 4.38 (s, 4H), 7.45–7.54 (m, 2H), 7.65–7.75 (m, 4H), 8.06–8.25 (m, 8H), 8.59 (br, s, 2H), 8.90–9.02 (m, 8H); LD-MS obsd 1120.4 [$M^+$+15], 1105.4 [$M^+$], 1063.4 [$M^{+-COCH_3}$], 1031.2 [$M^+$–$SCOCH_3$], 979.3 [$M^+$–I], 955.5 [$M^+$2 $SCOCH_3$], 936.1 [$M^+$–I–$COCH_3$], 904.5 [$M^+$–I–$SCOCH_3$]; FAB-MS obsd 1103.9500, calcd exact mass 1103.9504 ($C_{50}H_{34}I_2N_4O_2S_2Zn$); $\lambda_{abs}$ (toluene) 425, 551, 590 nm; $\lambda_{em}$ (toluene) 601, 646 nm.

Copper(II)-5,15-Bis(3-iodophenyl)-10,20-bis[3-(S-acetylthiomethyl)phenyl]porphyrin (Co-2)

A solution of 2 (23.6 mg, 22.6 $\mu$mol) in $CHCl_3$ (40 mL) and $Cu(OAc)_2 \cdot H_2O$ (100 mg, 0.5 mmol) in methanol (15 mL) were stirred for 2 h. 25.0 mg (12.6 $\mu$mol, 71%) of the title compound was obtained after column chromatography ($CH_2Cl_2$/hexanes 1:1) as an orange solid.

IR (neat): $\nu$=2918, 2846, 1686, 1584, 1510; LD-MS obsd 1118.0 [$M^+$+15], 1103.0 [$M^+$], 1061.0 [$M^{+-COCH_3}$], 1028.0 [$M^+$–$SCOCH_3$], 977.0 [$M^+$–I], 953.0 [$M^+$–2 $SCOCH_3$], 934.0 [$M^+$–I–$COCH_3$], 902.1 [$M^+$–I–$SCOCH_3$], 827.2 [$M^+$–I–2 $SCOCH_3$], 731.0 [$M^+$–2I–$SCOCH_3$]; FAB-MS obsd 1102.9495, calcd exact mass 1102.9509 ($C_{50}H_{34}CuI_2N_4O_2S_2$); $\lambda_{abs}$ (toluene) 419, 541, nm; $\lambda_{em}$ (toluene) 602, 653 nm.

Nickel(II)-5,15-Bis(3-iodophenyl)-10,20-bis[3-(S-acetylthiomethyl)phenyl]porphyrin (Ni-2)

A solution of 2 (18.2 mg, 17.5 $\mu$mol) in $CHCl_3$ (20 mL) and $Ni(OAc)_2 \cdot 4H_2O$ (100 mg, 402 $\mu$mol) in methanol (5 mL) were stirred for 4 days at reflux. The title compound was obtained without chromatography in quantitative yield as a brown-purple solid.

IR (neat): $\nu$=3056, 2921, 2849, 1691, 1584, 1555, 1508; $^1$H NMR (300.5 MHz, $CDCl_3$): $\delta$=2.38 (s, 6H), 4.35 (s, 4H), 7.36–7.45 (m, 2H), 7.57–7.67 (m, 4H), 7.86–7.91 (m, 2H), 7.94 (br, s, 2H), 7.97–8.01 (m, 2H), 8.03–8.08 (m, 2H), 8.38–8.41 (m, 2H), 8.72 (d, 4H, $^3J$=4.4 Hz), 8.75 (d, 4H, $^3J$=4.4 Hz); LD-MS obsd 1114.8 [$M^+$+15], 1099.8 [$M^{+1}$], 1058.6 [$M^+COCH_3$], 1024.7 [$M^+$–$SCOCH_3$], 973.6 [$M^+$–I], 949.5 [$M^+$–2 $SCOCH_3$]; FAB-MS obsd 1097.9591, calcd exact mass 1097.9566 ($C_{50}H_{34}I_2N_4NiO_2S_2$); $\lambda_{abs}$ (toluene) 417, 528, nm; $\lambda_{em}$ (toluene) 597, 646 nm.

5,10,15-Tris(2,6-difluorophenyl)-20-[4-{2-(trimethylsilyl)ethynyl}phenyl]porphyrin (3)

2,6-Difluorobenzaldehyde (509 mg, 3.6 mmol), 4-[2-(trimethylsilyl)ethynyl]benzaldehyde (Ravikanth, M. et al. (1998) *Tetrahedron* 54: 7721–7734) (200 mg, 1.0 mmol) and pyrrole (330 $\mu$l, 4.8 mmol) were dissolved in $CH_2Cl_2$ (200 mL). The solution was stirred at room temperature in the dark and $BF_3 \cdot O(Et)_2$ (150 $\mu$l, 1.9 mmol) was added. After 3 h DDQ was added and the mixture was stirred for an additional 1 h. Then the solvents were removed under reduced pressure and the resulting black solid was purified by three column chromatography procedures on silica (column 1: $CH_2Cl_2$/hexanes 1:2; column 2: $CH_2Cl_2$/hexanes 3:7; column 3: $CH_2Cl_2$/hexanes 1:2). The title porphyrin comprised the second purple band, affording 135 mg (165 $\mu$mol, 17%) of a brown-purple solid.

IR (neat): $\nu$=3315, 2153, 1578, 1508; $^1$H NMR (300.5 MHz, $CDCl_3$): $\delta$=–2.77 (s, 2H), 0.38 (s, 9H), 7.33–7.43 (m, 6H), 7.73–7.84 (m, 5H), 7.88, 8.17 (AA'BB', 2×2H), 8.82–8.90 (m, 8H); LD-MS obsd 817.9; FAB-MS obsd 818.2300, calcd exact mass 818.2300 ($C_{49}H_{32}F_6N_4Si$); $\lambda_{abs}$ (toluene) 419, 511, 544, 589, 644 nm.

Zinc(II)-5,10,15-Tris(2,6-difluorophenyl)-20-[4-{2-(trimethylsilyl)ethynyl} phenyl]-porphyrin (Zn-3)

A solution of 3 (110.0 mg, 134.3 $\mu$mol) in $CHCl_3$ (80 mL) and $Zn(OAc)_2 \cdot 2H_2O$ (300 mg, 1.4 mmol) in methanol (10 mL) were stirred for 5 h at room temperature. Then additional Zn(OAc)$_2$·2H$_2$O (110 mg, 0.5 mmol) was added because there was still free base porphyrin left. Stirring was continued for 9 h then more Zn(OAc)$_2$·2H$_2$O (634 mg, 2.9 mmol) was added. After additional 4 h the reaction was quenched with water (60 mL). Purification by column chromatography (silica, CH$_2$Cl$_2$/hexanes 1:1) afforded 106 mg (120.1 µmol, 89%) of the title compound as a red-purple solid.

IR (neat): ν=2955, 2155, 1578, 1496; $^1$H NMR (300.5 MHz, d$_8$-THF): δ=0.36 (s, 9H), 7.40–7.51 (m, 6H), 7.81–7.94 (m, 5H), 8.18–8.24 (m, 2H), 8.82–8.89 (m, 8H); LD-MS obsd 879.3; FAB-MS obsd 880.1470, calcd exact mass 880.1435 (C$_{49}$H$_{30}$F$_6$N$_4$SiZn); λ$_{abs}$ (toluene) 423, 548 nm.; λem (toluene) 592, 642 nm.

Zinc(II)-20-(4-Ethynylphenyl)-5,10,15-tris(2,6-difluorophenyl)porphyrin (Zn-4)

To a solution of Zn-3 (82 mg, 93.2 µmol) in THF (9 mL) was added a suspension of K$_2$CO$_3$ (30 mg, 217 µmol) in methanol (3 mL). The mixture was stirred for 1 h at room temperature in the dark. Then CH$_2$Cl$_2$ (20 mL) was added. The mixture was washed with aqueous 5% NaHCO$_3$ solution (20 niL) and dried (Na$_2$SO$_4$). Purification by column chromatography (silica, CH$_2$Cl$_2$/hexanes 1:2) afforded 58 mg (71.6 µmol, 77%) of the title compound as a red-purple solid.

IR (neat): ν=3107, 2924, 2849, 2108, 1581; $^1$H NMR (300.5 MHz, CDCl$_3$): δ=3.32 (s, 1H), 7.34–7.44 (m, 6H), 7.74–7.93 (m, 5H), 8.17–8.23 (m, 2H), 8.91–8.99 (m, 8H); LD-MS obsd 808.2; FAB-MS obsd 808.1050, calcd exact mass 808.1040 (C$_{46}$H$_{22}$F$_6$N$_4$Zn); λ$_{abs}$ (toluene) 423, 548 nm.; λ$_{em}$ (toluene) 592, 642 nm.

General procedure for Pd-coupling reactions

The porphyrins, Pd$_2$(dba)$_3$ and P(o-tol)$_3$ were placed in a Schlenk flask, which was evacuated and purged with argon three times. Then the solvents were added, which were purged with argon for 30 min. The Schlenk flask was placed in a preheated oil bath (35° C.). The mixture was then stirred at this temperature under argon in the dark. When the reaction was finished (checked by analytical SEC on HPLC) the flask was cooled to room temperature and the solvents were removed under reduced pressure. To remove P(o-tol)$_3$ the whole mixture was filtered through a short silica column. The different porphyrin products were then separated on a SEC column with toluene as eluent.

Trimer ZnZnZn-5

Zn-2 (10.0 mg, 9.0 µmol), Zn(II)-5-(4-ethynylphenyl)-10,15,20-trimesitylporphyrin (Wagner, R. et al., (1995) *J. Org. Chem.* 60: 5266–5273) (15.0 mg, 18.1 µmol), Pd$_2$(dba)$_3$ (2.5 mg, 2.7 µmol) and P(o-tol)$_3$ (6.6 mg, 21.7 µmol) were dissolved in a mixture of THF (6.0 mL) and TEA (1.2 mL). After 24 h the reaction was finished. The mixture was filtered over silica with CH$_2$Cl$_2$/hexanes 2:3. After the SEC column an additional column chromatography was done (silica, CH$_2$Cl$_2$/hexanes 5:1) to give 9.0 mg (3.6 µmol, 40%) of the title compound as a purple solid.

IR (neat): ν=2923, 2857, 1688, 1597, 1498; $^1$H NMR (300.5 MHz, d$_8$-THF): δ=1.80–1.87 (m, 36H), 2.36–2.40 (m, 6H), 2.56–2.62 (m, 18H), 4.47 (s, 4H), 7.23–7.30 (m, 12H), 7.68–7.79 (m, 4H), 7.85–8.00 (m, 6H), 8.08–8.34 (m, 12H), 8.57 (br, s, 2H), 8.59–8.62 (m, 8H), 8.63 (d, 2H, $^3$J=4.4 Hz), 8.64 (d, 2H, $^3$J =4.4 Hz), 8.77 (d, 2H, $^3$J=4.4 Hz), 8.78 (d, 2H, $^3$J=4.4 Hz), 8.95 (d, 4H, $^3$J=5.1 Hz), 8.98 (d, 4H, $^3$J=5.1 Hz); LD-MS obsd 2509.4 [M$^+$], 2463.4 [M$^+$–COCH$_3$], 2435.2 [M$^{+-}$SCOCH$_3$], 2360.3 [M$^+$–2 SCOCH$_3$]; FAB-MS obsd 2500.72, calcd exact mass 2500.73 (Cl$_{160}$H$_{124}$N$_{12}$O$_2$S$_2$Zn$_3$); λ$_{abs}$ (toluene) 424, 552, 593 nm; λ$_{em}$ (toluene) 601, 651 mn.

Trimer ZnNiZn-5

Ni-2 (10.0 mg, 9.1 µmol), Zn(II)-5-(4-ethynylphenyl)-10,15,20-trimesitylporphyrin (Wagner, R. et al. (1995) *J. Org. Chem.* 60: 5266–5273) (15.1 mg, 18.2 µmol), Pd$_2$(dba)$_3$ (2.5 mg, 2.7 µmol) and P(o-tol)$_3$ (6.7 mg, 22.0 µmol) were dissolved in a mixture of THF (6.0 mL) and TEA (1.2 mL). After 20.5 h an additional amount of Pd$_2$(dba)$_3$ (3.2 mg, 3.5 µmol) was added because the reaction had stopped. Stirring was continued for additional 20 h. The mixture was filtered over silica with CH$_2$Cl$_2$/hexanes 3:1. After SEC, 5.9 mg (2.4 µmol, 26%) of the title compound was obtained as a purple solid.

IR (neat): ν=2921, 2857, 1700, 1595, 1508; $^1$H NMR (300.5 MHz, d$_8$-THF): δ=1.83 (s, 36H), 2.35 (s, 6H), 2.59 (s, 18H), 4.41 (s, 4H), 7.27 (s, 12H), 7.64–7.74 (m, 4H), 7.80–7.87 (m, 2H), 7.91–7.98 (m, 6H), 8.04–8.13 (m, 6H), 8.18–8.23 (m, 4H), 8.39 (br, s, 2H), 8.60 (s, 8H), 8.63 (d, 4H, $^3$J=4.4 Hz), 8.77 (d, 4H, $^3$J=4.4 Hz), 8.84 (d, 4H, $^3$J=4.4 Hz), 8.87 (d, 4H, $^3$L=5.1 Hz); LD-MS obsd 2502.7 [M$^+$], 2476.0 [M$^+$–CO], 2459.7 [M$^+$–COCH$_3$], 2428.3 [M$^+$–SCOCH$_3$], 2385.3 [M$^+$–SCOCH$_3$–COCH$_3$], 2355.3 [M+–2 SCOCH$_3$]; FAB-MS obsd 2499.63, calcd exact mass 2499.73 (Cl$_{160}$H$_{124}$NiN$_{12}$O$_2$S$_2$Zn$_2$); λ$_{abs}$ (toluene) 424, 551, 593 nm; λ$_{em}$ (toluene) 600, 646 nm.

Trimer ZnCuZn-5

Cu-2 (9.9 mg, 9.0 µmol), Zn(II)-5-(4-ethynylphenyl)-10,15,20-trimesitylporphyrin (Wagner, R. et al. (1995) *J. Org. Chem.* 60: 5266–5273) (14.2 mg, 17.1 µmol), Pd$_2$(dba)$_3$ (2.5 mg, 2.7 µmol) and P(o-tol)$_3$ (6.6 mg, 21.7 µmol) were suspended in a mixture of THF (8.1 mL) and TEA (3.6 mL). Even after sonication complete dissolution could not be obtained. After 18.5 h stirring at 40° C. an additional amount of Pd$_2$(dba)$_3$ (1.3 mg, 1.4 µmol) was added because the reaction had stopped (probably because of insufficient solubility). Stirring was continued for an additional 9 h. The mixture was filtered over silica with CH$_2$Cl$_2$/hexanes 4:1. After SEC, 11.4 mg (4.6 µmol, 51%) of the title compound was obtained as a purple solid.

IR (neat): ν=2919, 2857, 1696, 1595; LD-MS obsd 2508.5 [M$^+$], 2480.8 [M$^+$–CO], 2463.1 [M$^+$–COCH$_3$], 2433.8 [M$^+$–SCOCH$_3$], 2388.3 [M$^+$–SCOCH$_3$–COCH$_3$], 2358.0 [M$^+$–2 SCOCH$_3$], 2268.5 [M$^{+-}$2 SCOCH$_3$–PhCH$_2$]; FAB-MS obsd 2504.82, calcd exact mass 2504.73 (C$_{160}$H$_{124}$CuN$_{12}$O$_2$S$_2$Zn$_2$); λ$_{abs}$ (toluene) 424, 549 nm; λ$_{em}$ (toluene) 596, 646 nm.

Trimer MgCuMg-5

Cu-2 (10.2 mg, 9.2 µmol), Mg(II)-5-(4-ethynylphenyl)-10,15,20-trimesitylporphyrin (Li, F. et al. (1997) *J. Mater. Chem.* 7: 1245–1262) (14.6 mg, 18.5 µmol), Pd$_2$(dba)$_3$ (2.6 mg, 2.8 µmol) and P(o-tol)$_3$ (6.8 mg, 22.3 vmol) were suspended in a mixture of THF (10.0 mL) and TEA (2.0 mL). Even after sonication no solution could be obtained. After 6 h an additional amount of Pd$_2$(dba)$_3$ (1.0 mg, 1.1 µmol) was added because the reaction had stopped (probably because of insufficient solubility). Stirring was continued for additional 18 h. The mixture was filtered over alumina with CH$_2$Cl$_2$ (1% MeOH). After SEC 4.8 mg (2.0 µmol, 21%) of the title compound was obtained as a purple solid.

IR (neat): ν=2922, 2858, 1700, 1593; LD-MS obsd 2425.9 [M⁺], 2380.2 [M⁺–COCH₃], 2351.1 [M⁺–SCOCH₃], 2309.3 [M⁺–SCOCH₃–COCH₃], 2275.2 [M⁺–2 SCOCH₃]; calcd exact mass 2419.85 ($C_{160}H_{124}CuMg_2N_2O_2S_2$); $\lambda_{abs}$ (toluene) 430, 543, 566, 606 nm; $\lambda_{em}$ (toluene) 612, 665 nm.

Trimer ZnZnZn6

Zn-2 (10.0 mg, 9.0 μmol), Zn-4 (14.6 mg, 18.0 μmol), Pd₂(dba)₃ (2.5 mg, 2.7 μmol) and P(o-tol)₃ (6.7 mg, 22.0 μmol) were dissolved in a mixture of THF (6.0 mL) and TEA (1.2 mL). After 39 h the reaction was finished. The mixture was filtered over silica with CH₂Cl₂/hexanes 2:3. After the SEC column an additional column chromatography was done (silica, gradient, CH₂Cl₂/hexanes 1:1 to pure CH₂Cl₂) to give 8.5 mg (3.4 μmol, 38%) of the title compound as a purple solid.

IR (neat): ν=2923, 2849, 1694, 1584, 1496; ₁H NMR (300.5 MHz, d₈-THF): δ=2.36–2.39 (m, 6H), 4.47 (s, 4H), 7.40–7.49 (m, 12H), 7.68–8.34 (m, 28H), 8.57 (br, s, 2H), 8.82–8.87 (m, 12H), 8.90 (d, 2H, ³J=4.4 Hz), 8.91 (d, 2H, ³J=4.4 Hz), 8.95 (d, 4H, ³J=4.4 Hz), 8.99 (d, 4H, ³J=5.1 Hz); LD-MS obsd 2470.8 [M⁺]2396.2 [M⁺–SCOCH₃], 2352.1 [M⁺–SCOCH₃–COCH₃], 2319.5 [M+–2 SCOCH₃], 2331.2 [M⁺–2 SCOCH₃–PhCH₂]; FAB-MS obsd 2470.41, calcd exact mass 2470.33 ($C_{142}H_{76}F_{12}N_{12}O_2S_2Zn_3$); $\lambda_{abs}$ (toluene) 423, 550 nm; $\lambda_{em}$ (toluene) 597, 644 nm.

The foregoing is illustrative of the present invention, and is not to be construed as limiting thereof. The invention is defined by the following claims, with equivalents of the claims to be included therein.

What is claimed is:

1. An apparatus for storing data, said apparatus comprising:

a fixed electrode electrically coupled to a storage medium having a plurality of different and distinguishable oxidation states wherein data is stored in said oxidation states by the addition or withdrawal of one or more electrons from said storage medium via the electrically coupled electrode;

and wherein said storage medium comprises a molecule having the formula:

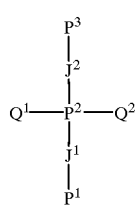

(I)

wherein

P¹ and P³ are porphyrinic macrocycles selected to have the same oxidation state;

P² is a porphyrinic macrocycle selected to have an oxidation state different from P¹ and P³;

J¹ and J² are independently selected linkers that permit electron transfer between the porphyrinic macrocycles;

Q¹ and Q² are each independently selected linkers; wherein said storage medium comprises a molecule having at least four different and distinguishable oxidation states.

2. The apparatus of claim 1, wherein P¹ and P³ are oriented laterally with respect to P².

3. The apparatus of claim 1, wherein P¹ and P³ are oriented obliquely with respect to P².

4. The apparatus of claim 1, wherein
J¹ and J² are the same; and
Q¹ and Q² are the same.

5. The apparatus of claim 1, wherein said storage medium has a memory storage density of at least about 10 gigabits per cm² in a sheet-like device.

6. The apparatus of claim 1, wherein said storage medium is covalently linked to said electrode by at least one of Q¹ and Q².

7. The apparatus of claim 1, wherein said electrode has a substantially flat planar surface portion, and said storage medium is covalently linked to said electrode surface portion by both of Q¹ and Q² so that porphyrinic macrocycle P² is positioned substantially horizontally thereto.

8. The apparatus of claim 1, wherein Q¹ and Q² are thiol linkers.

9. The apparatus of claim 1, wherein said storage medium is juxtaposed in the proximity of said electrode such that electrons can pass from said storage medium to said electrode.

10. The apparatus of claim 1, wherein said storage medium is juxtaposed to a dielectric material embedded with counterions.

11. The apparatus of claim 1, wherein said storage medium and said electrode are fully encapsulated in an integrated circuit.

12. The apparatus of claim 1, wherein said storage medium is electronically coupled to a second electrode that is a reference electrode.

13. The apparatus of claim 1, wherein said storage medium is present on a single plane in said device.

14. The apparatus of claim 1, wherein said storage medium is present at a multiplicity of storage locations.

15. The apparatus of claim 14, wherein said apparatus comprises multiple planes and said storage locations are present on multiple planes of said apparatus.

16. The apparatus of claim 14, wherein said storage locations range from about 1024 to about 4096 different locations.

17. The apparatus of claim 16, wherein each location is addressed by a single electrode.

18. The apparatus of claim 16, wherein each location is addressed by two electrodes.

19. The apparatus of claim 1, wherein said electrode is connected to a voltage source.

20. The apparatus of claim 19, wherein said voltage source is the output of an integrated circuit.

21. The apparatus of claim 1, wherein said electrode is connected to a device to read the oxidation state of said storage medium.

22. The apparatus of claim 21, wherein said device is selected from the group consisting of a voltammetric device, an amperometric device, and a potentiometric device.

23. The apparatus of claim 22, wherein said device is a sinusoidal voltammeter.

24. The apparatus of claim 21, wherein said device provides a Fourier transform of the output signal from said electrode.

25. The apparatus of claim 21, wherein said device refreshes the oxidation state of said storage medium after reading said oxidation state.

26. The apparatus of claim 1, wherein said different and distinguishable oxidation states of said storage medium can be set by a voltage difference no greater than about 2 volts.

27. The apparatus of claim 1, wherein said storage medium comprises a molecule having the formula:

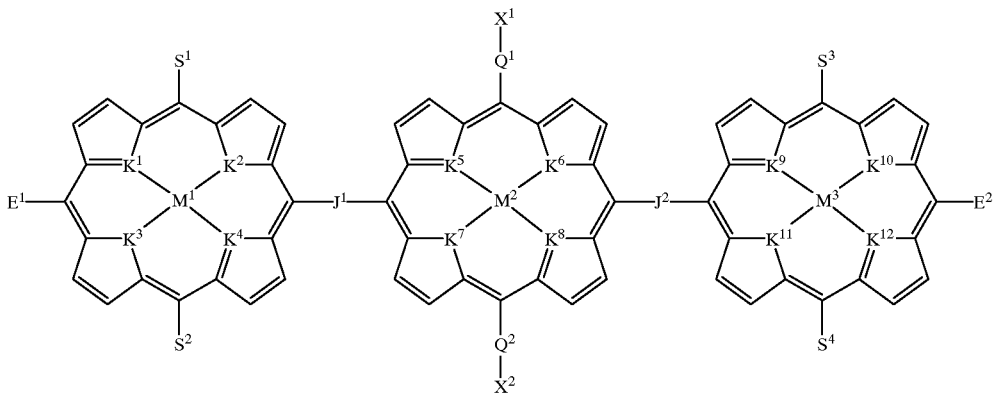

where

S¹, S², S³, and S⁴ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts;

$M^1$, $M^2$, and $M^3$ are independently selected metals;

$K^1$, $K^2$, $K^3$, $K^4$, $K^5$, $K^6$, $K^7$, $K^8$, $K^9$, $K^{10}$, $K^{11}$, and $K^{12}$ are independently selected from the group consisting of N, O, S, Se, Te, and CH;

$J^1$ and $J^2$ are independently selected linkers;

$Q^1$ and $Q^2$ are independently selected linkers;

$X^1$ and $X^2$ are independently selected from the group consisting of a substrate, a reactive site that can covalently couple to a substrate, and a reactive site that can ionically couple to a substrate;

$E^1$ and $E^2$ are independently selected terminating substituents; and said molecule has at least two different and distinguishable oxidation states.

28. The apparatus of claim 27, wherein $E^1$ and $E^2$ are independently selected terminating substituents selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl, wherein said substituents provide a redox potential range of less than about 2 volts.

29. The apparatus of claim 27, wherein $M^1$, $M^2$, and $M^3$ are independently selected from the group consisting of Fe, Zn, Mg, Cd, Hg, Cu, Ag, Au, Ni, Pd, Pt, Co, Rh, Ir, Mn, B, Al, Ga, Pb, and Sn.

30. The apparatus of claim 27, wherein $M^1$ and $M^2$ are different, and $M^1$ and $M^3$ are the same.

31. The apparatus of claim 27, wherein $J^1$ and $J^2$ are linear linkers or oblique linkers.

32. The apparatus of claim 27, wherein $J^1$ and $J^2$ are independently selected from the group consisting of 4,3'-diphenylethyne, 4,3'-diphenylbutadiyne, 4,3'-biphenyl, 1,3-phenylene, 4,3'stilbene, 4,3'azobenzene, 4,3'-benzylideneaniline, and 4,3''-terphenyl.

33. The apparatus of claim 27, wherein $X^1$ and $X^2$ are protected or unprotected reactive sites selected from the group consisting of thio, seleno and telluro groups.

34. The apparatus of claim 27, wherein $Q^1$ and $Q^2$ are linear linkers or oblique linkers.

35. The apparatus of claim 27, wherein $X^1$—$Q^1$— and $X^2$—$Q^2$— are independently selected from the group consisting of 3-(2-(4-mercaptophenyl)ethynyl)phenyl, 3-mercaptomethylphenyl, 3-hydroselenophenyl, 3-(2-(4-hydroselenopenyl)ethynyl)phenyl, 3-hydrotellurophenyl, and 3-(2-(4-hydrotellurophenyl)ethynyl)phenyl.

36. The apparatus of claim 27, wherein
$K^1$, $K^2$, $K^3$, $K^4$, $K^5$, $K^6$, $K^7$, $K^8$, $K^9$, $K^{10}$, $K^{11}$, and $K^{12}$ are the same;
$M^1$ and $M^3$ are the same;
$M^1$ and $M^2$ are different;
$S^1$, $S^2$, $S^3$ and $S^4$ are the same; and
$E^1$ and $E^2$ are the same.

37. An information storage medium, said storage medium comprising at least one storage molecule such that said storage medium has at least two different and distinguishable non-neutral oxidation states;

and wherein said storage medium comprises a molecule having the formula:

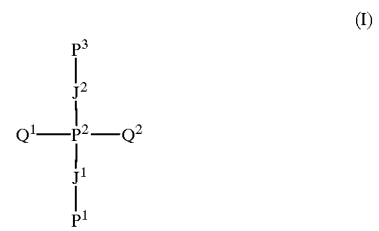

(I)

wherein $P^1$ and $P^3$ are porphyrinic macrocycles selected to have the same oxidation state;

$P^2$ is a porphyrinic macrocycle selected to have an oxidation state different from $P^1$ and $P^3$;

$J^1$ and $J^2$ are independently selected linkers that permit electron transfer between the porphyrinic macrocycles;

$Q^1$ and $Q^2$ are each independently selected linkers;

and wherein said storage medium comprises a molecule having at least four different and distinguishable oxidation states.

38. The storage medium of claim 37, wherein $P^1$ and $P^3$ are oriented laterally with respect to $P^2$.

39. The storage medium of claim 37, wherein $P^1$ and $P^3$ are oriented obliquely with respect to $P^2$.

40. The storage medium of claim 37, wherein
$J^1$ and $J^2$ are the same; and $Q^1$ and Q2 are the same.

41. The storage medium of claim 37, wherein each storage molecule is present at a discrete storage location on a substrate.

42. The storage medium of claim 37, wherein the storage molecule is in contact with a dielectric material embedded with counterions.

43. The storage medium of claim 37, wherein said storage medium has a memory storage density of at least about 10 gigabits per $cm^2$ in a sheet-like device.

44. The storage medium of claim 37, wherein said storage medium is covalently linked to an electrode by at least one of $Q^1$ and $Q^2$.

45. The storage medium of claim 37, wherein said storage medium has a substantially flat planar surface portion, and said storage medium is covalently linked to said storage medium surface portion by both of $Q^1$ and $Q^2$ so that porphyrinic macrocycle $P^2$ is positioned substantially horizontally thereto.

46. The storage medium of claim 37, wherein $Q^1$ and $Q^2$ are thiol linkers.

47. The storage medium of claim 37, wherein said storage medium is juxtaposed in the proximity of said electrode such that electrons can pass from said storage medium to said electrode.

48. The storage medium of claim 37, wherein said storage medium is juxtaposed to a dielectric material embedded with counterions.

49. The storage medium of claim 37, wherein said storage medium is present on a single plane in said device.

50. The storage medium of claim 37, wherein said storage medium is present at a multiplicity of storage locations.

51. The storage medium of claim 50, wherein said apparatus comprises multiple planes and said storage locations are present on multiple planes of said apparatus.

52. The storage medium of claim 50, wherein said storage locations range from about 1024 to about 4096 different locations.

53. The storage medium of claim 37, wherein said storage medium comprises a molecule having the formula:

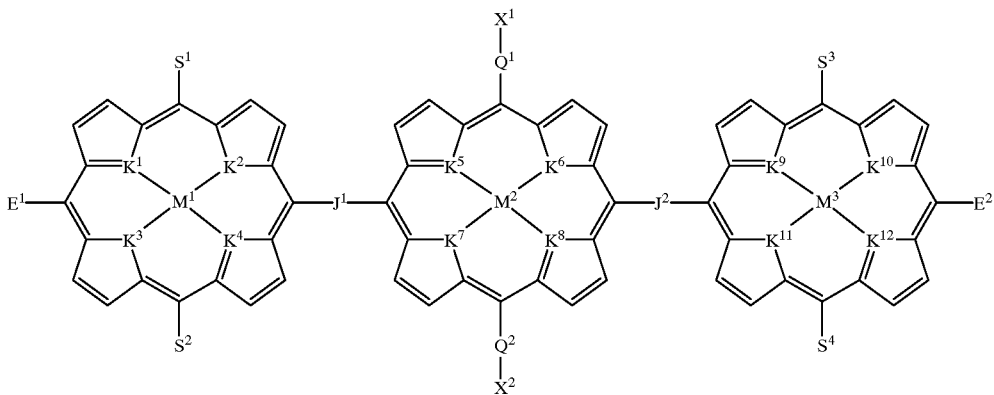

wherein $S^1$, $S^2$, $S^3$, and $S^4$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts;

$M^1$, $M^2$, and $M^3$ are independently selected metals;

$K^1$, $K^2$, $K^3$, $K^4$, $K^5$, $K^6$, $K^7$, $K^8$, $K^9$, $K^{10}$, $K^{11}$, and $K^{12}$ are independently selected from the group consisting of N, O, S, Se, Te, and CH;

$J^1$ and $J^2$ are independently selected linkers;

$Q^1$ and $Q^2$ are independently selected linkers;

$X^1$ and $X^2$ are independently selected from the group consisting of a substrate, a reactive site that can covalently couple to a substrate, and a reactive site that can ionically couple to a substrate;

$E^1$ and $E^2$ are independently selected terminating substituents; and said molecule has at least two different and distinguishable oxidation states.

54. The storage medium of claim 53, wherein $E^1$ and $E^2$ are independently selected terminating substituents selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl, wherein said substituents provide a redox potential range of less than about 2 volts.

55. The storage medium of claim 53, wherein $M^1$, $M^2$, and $M^3$ are independently selected from the group consisting of Fe, Zn, Mg, Cd, Hg, Cu, Ag, Au, Ni, Pd, Pt, Co, Rh, Ir, Mn, B, Al, Ga, Pb, and Sn.

56. The storage medium of claim 53, wherein $M^1$ and $M^2$ are different, and $M^1$ and $M^3$ are the same.

57. The storage medium of claim 53, wherein $J^1$ and $J^2$ are linear linkers or oblique linkers.

58. The storage medium of claim 53, wherein $J^1$ and $J^2$ are independently selected from the group consisting of 4,3'-diphenylethyne, 4,3'-diphenylbutadiyne, 4,3'-biphenyl, 1,3-phenylene, 4,3'stilbene, 4,3'azobenzene, 4,3'-benzylideneaniline, and 4,3"-terphenyl.

59. The storage medium of claim 53, wherein $X^1$ and $X^2$ are protected or unprotected reactive sites selected from the group consisting of thio, seleno and telluro groups.

60. The storage medium of claim 53, wherein $Q^1$ and $Q^2$ are linear linkers or oblique linkers.

61. The storage medium of claim 53, wherein $X^1$—$Q^1$ and $X^2$—$Q^2$ are independently selected from the group consisting of 4-(2-(4-mercaptophenyl)ethynyl)phenyl, 4-mercaptomethylphenyl, 4-hydroselenophenyl, 4-(2-(4-hydroselenopenyl)ethynyl)phenyl, 4-hydrotellurophenyl, and 4-(2-(4-hydrotellurophenyl)ethynyl)phenyl.

62. The storage medium of claim 53, wherein
$K^1$, $K^2$, $K^3$, $K^4$, $K^5$, $K^6$, $K^7$, $K^8$, $K^9$, $K^{10}$, $K^{11}$, and $K^{12}$ are the same;
$M^1$ and $M^3$ are the same;
$M^1$ and $M^2$ are different;
$S^1$, $S^2$, $S^3$ and $S^4$ are the same; and
$E^1$ and $E^2$ are the same.

63. A molecule for the storage of information, said molecule having the formula:

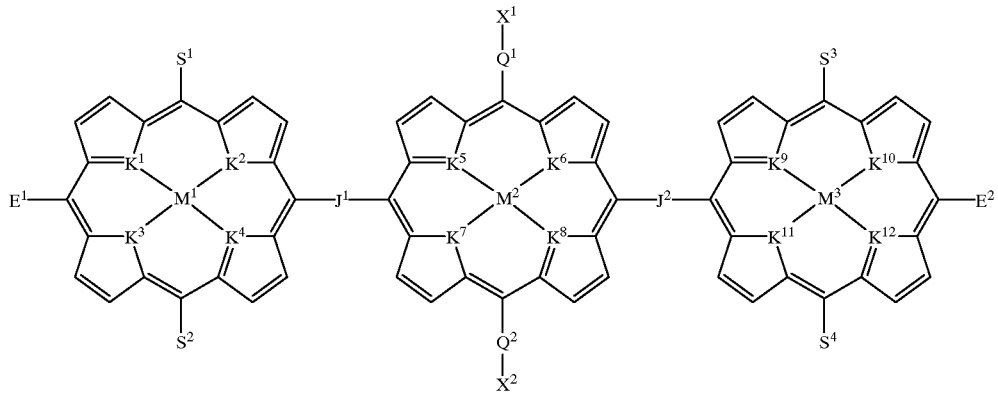

wherein
$S^1$, $S^2$, $S^3$, and $S^4$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts;
$M^1$, $M^2$, and $M^3$ are independently selected metals;
$K^1$, $K^2$, $K^3$, $K^4$, $K^5$, $K^6$, $K^7$, $K^8$, $K^9$, $K^{10}$, $K^{11}$, and $K^{12}$ are independently selected from the group consisting of N, O, S, Se, Te, and CH;
$J^1$ and $J^2$ are independently selected linkers;
$Q^1$ and $Q^2$ are independently selected linkers;
$X^1$ and $X^2$ are independently selected from the group consisting of a substrate, reactive site that can covalently couple to a substrate, and a reactive site that can onically couple to a substrate;
$E^1$ and $E^2$ are independently selected terminating substituents;
and wherein said molecule has at least four different and distinguishable xidation states.

64. The molecule of claim 63, wherein $E^1$ and $E^2$ are independently selected erminating substituents selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl, wherein said substituents provide a redox potential range of less than about 2 volts.

65. The molecule of claim 63, wherein $M^1$, $M^2$, and $M^3$ are independently selected from the group consisting of Fe, Zn, Mg, Cd, Hg, Cu, Ag, Au, Ni, Pd, Pt, Co, Rh, Ir, Mn, B, Al, Ga, Pb, and Sn.

66. The molecule of claim 63, wherein $M^1$ and $M^2$ are different, and $M^1$ and $M^3$ are the same.

67. The molecule of claim 63, wherein $J^1$ and $J^2$ are linear linkers or oblique linkers.

68. The molecule of claim 63, wherein $J^1$ and $J^2$ are independently selected from the group consisting of 4,3'-diphenylethyne, 4,3'-diphenylbutadiyne, 4,3'-biphenyl, 1,3-phenylene, 4,3'stilbene, 4,3'azobenzene, 4,3'-benzylideneaniline, and 4,3"-terphenyl.

69. The molecule of claim 63, wherein $X^1$ and $X^2$ are protected or unprotected reactive sites selected from the group consisting of thio, seleno and telluro groups.

70. The molecule of claim 63, wherein $Q^1$ and $Q^2$ are linear linkers or oblique inkers.

71. The molecule of claim 63, wherein $X^1$—$Q^1$— and $X^2$—$Q^2$— are independently selected from the group consisting of 3-(2-(4-mercaptophenyl)ethynyl)phenyl, 3-mercaptomethylphenyl, 3-hydroselenophenyl, 3-(2-(4-hydroselenopenyl)ethynyl)phenyl, 3-hydrotellurophenyl, and 3-(2-(4-hydrotellurophenyl)ethynyl)phenyl.

72. The molecule of claim 63, wherein
$K^1$, $K^2$, $K^3$, $K^4$, $K^5$, $K^6$, $K^7$, $K^8$, $K^9$, $K^{10}$, $K^{11}$, and $K^{12}$ are the same;
$M^1$ and $M^3$ are the same;
$M^1$ and $M^2$ are different;
$S^1$, $S^2$, $S^3$ and $S^4$ are the same; and
$E^1$ and $E^2$ are the same.

73. A method of storing data, said method comprising:
(i) providing an apparatus according to claim 1; and
(ii) applying a voltage to said electrode at sufficient current to set an oxidation state of said storage medium.

74. The method of claim 73, wherein said voltage ranges up to about 2 volts.

75. The method of claim 73, wherein said voltage is the output of an integrated circuit.

76. The method of claim 73, further comprising detecting the oxidation state of said storage medium and thereby reading out the data stored therein.

77. The method of claim 76, wherein said detecting the oxidation state of the storage medium further comprises refreshing the oxidation state of the storage medium.

78. The method of claim 76, wherein said detecting comprises analyzing a readout signal in the time domain.

79. The method of claim 76, wherein said detecting comprises analyzing a readout signal in the frequency domain.

80. The method of claim 79, wherein said detecting comprises performing a Fourier transform on said readout signal.

81. The method of claim 76, wherein said detecting utilizes a voltammetric method.

82. In a computer system, a memory device, said memory device comprising the apparatus of claim 1.

83. A computer system comprising a central processing unit, a selector device, and a memory device, said memory device comprising the apparatus of claim 1.

84. A computer system according to claim 83, further comprising a display.

* * * * *